United States Patent
Lee

(10) Patent No.: US 11,722,137 B1
(45) Date of Patent: Aug. 8, 2023

(54) VARIABLE-DISTANCE PROXIMITY DETECTOR

(71) Applicant: META PLATFORMS TECHNOLOGIES, LLC, Menlo Park, CA (US)

(72) Inventor: Mark Robert Lee, Edmonds, WA (US)

(73) Assignee: Meta Platforms Technologies, LLC, Menlo Park, CA (US)

(*) Notice: Subject to any disclaimer, the term of this patent is extended or adjusted under 35 U.S.C. 154(b) by 3 days.

(21) Appl. No.: 17/488,874

(22) Filed: Sep. 29, 2021

Related U.S. Application Data

(60) Provisional application No. 63/087,091, filed on Oct. 2, 2020.

(51) Int. Cl.
  *H03K 17/955* (2006.01)
  *G06F 3/044* (2006.01)
  *H03K 17/945* (2006.01)

(52) U.S. Cl.
  CPC .......... *H03K 17/955* (2013.01); *G06F 3/044* (2013.01); *G06F 2203/04108* (2013.01); *H03K 2017/9455* (2013.01)

(58) Field of Classification Search
  None
  See application file for complete search history.

(56) References Cited

U.S. PATENT DOCUMENTS

| | | | | |
|---|---|---|---|---|
| 6,809,527 B2* | 10/2004 | Ishio | .................. | G01R 27/2605 324/661 |
| 8,547,114 B2* | 10/2013 | Kremin | .................. | H03M 11/02 324/678 |
| 9,274,154 B2* | 3/2016 | Togura | .................. | H03K 17/955 |
| 10,816,582 B2* | 10/2020 | Hargreaves | .......... | H03K 17/962 |
| 11,481,072 B2* | 10/2022 | Fan | ...................... | H03K 17/962 |
| 2006/0244466 A1* | 11/2006 | Call | ........................ | A61B 5/447 324/661 |
| 2008/0252474 A1* | 10/2008 | Nakamura | ........... | H03K 17/955 340/657 |
| 2011/0148440 A1* | 6/2011 | Bruwer | ................. | H03K 17/955 324/684 |
| 2015/0145535 A1* | 5/2015 | Nys | ..................... | G06F 3/04182 324/679 |
| 2017/0060342 A1* | 3/2017 | Tang | ..................... | G06F 3/0418 |
| 2017/0191853 A1* | 7/2017 | Hernes | ..................... | G01D 5/24 |

* cited by examiner

*Primary Examiner* — Thomas J. Hiltunen
*Assistant Examiner* — Khareem E Almo
(74) *Attorney, Agent, or Firm* — Greenberg Traurig, LLP

(57) ABSTRACT

The disclosed apparatus may include a capacitive proximity sensor that increases capacitance in response to proximity of an object; a reference capacitor in parallel with the capacitive proximity sensor; a switch that connects and disconnects the capacitive proximity sensor and the reference capacitor; and a capacitance sensing block that generates a capacitance signal based on a capacitance of the reference capacitor when the switch is in a disconnecting state and based on the capacitance of the reference capacitor and a capacitance of the capacitive proximity sensor when the switch is in a connecting state. Various other methods and systems are also disclosed.

20 Claims, 15 Drawing Sheets

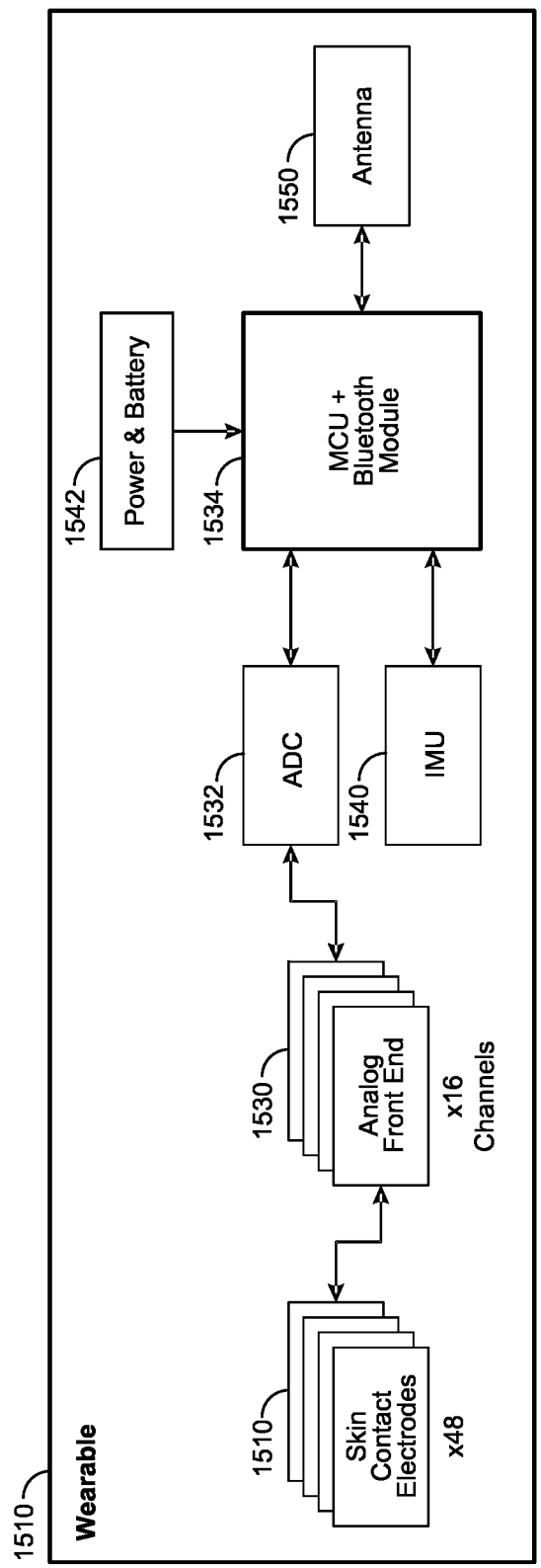
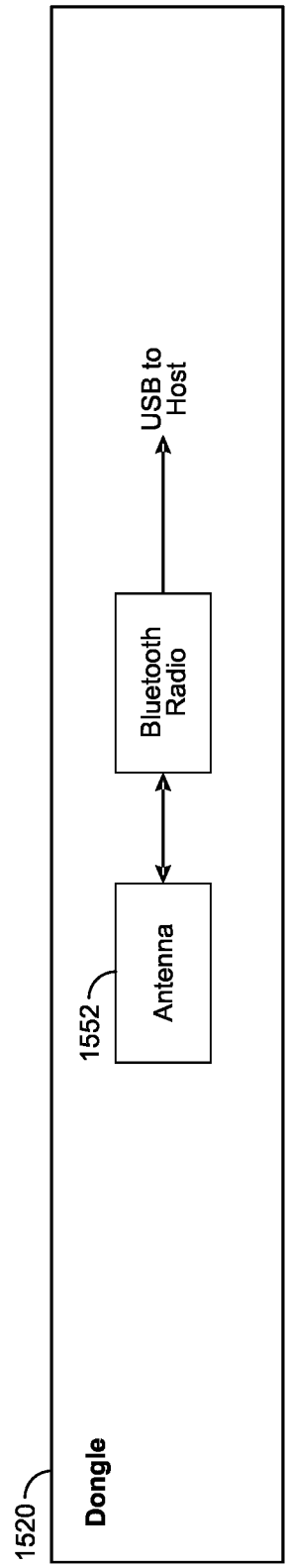
FIG. 15A
FIG. 15B

VARIABLE-DISTANCE PROXIMITY DETECTOR

CROSS REFERENCE TO RELATED APPLICATION

This application claims the benefit of U.S. Provisional Application No. 63/087,091, filed 2 Oct. 2020, the disclosures of each of which are incorporated, in their entirety, by this reference.

BRIEF DESCRIPTION OF THE DRAWINGS

The accompanying drawings illustrate a number of exemplary embodiments and are a part of the specification. Together with the following description, these drawings demonstrate and explain various principles of the present disclosure.

FIGS. 15A and 15B are illustrations of an exemplary schematic diagram with internal components of a wearable system.

Figure 1:
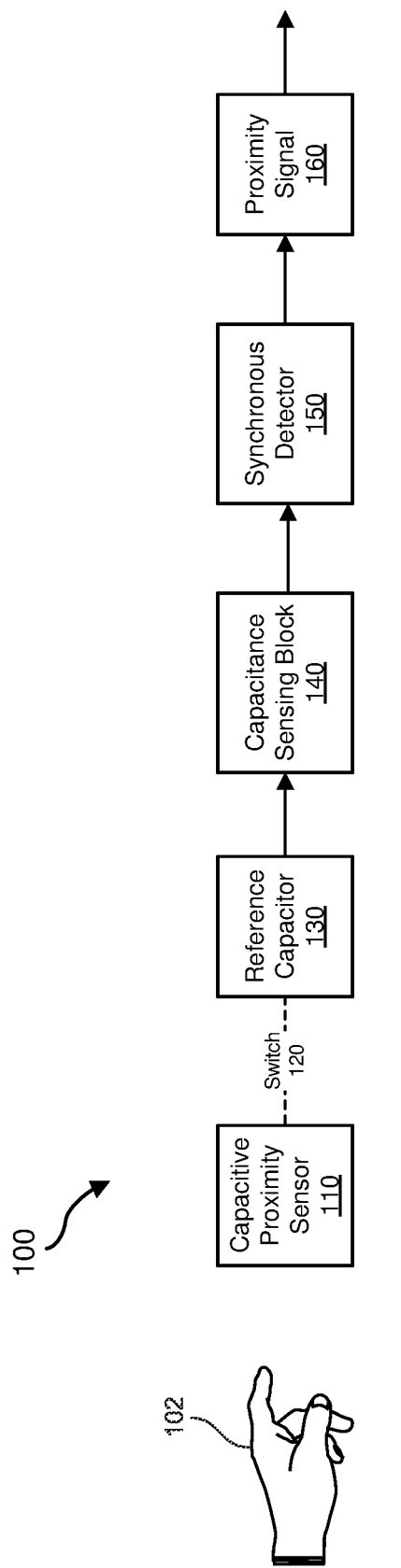
FIG. 1 is a block diagram of an exemplary proximity-sensing system according to embodiments of this disclosure.

Throughout the drawings, identical reference characters and descriptions indicate similar, but not necessarily identical, elements. While the exemplary embodiments described herein are susceptible to various modifications and alternative forms, specific embodiments have been shown by way of example in the drawings and will be described in detail herein. However, the exemplary embodiments described herein are not intended to be limited to the particular forms disclosed. Rather, the present disclosure covers all modifications, equivalents, and alternatives falling within the scope of the appended claims.

DETAILED DESCRIPTION OF EXEMPLARY EMBODIMENTS

In capacitive proximity sensing, a capacitive proximity sensor and an object may act as a simple capacitor, where an internal sensing plate of the capacitive proximity sensor acts as one plate of the capacitor and the object acts as another plate. As the two plates are brought closer together, the capacitance of the plates may increase. Likewise, as the two plates are taken farther apart, the capacitance of the plates may decrease. Some configurations of capacitive proximity sensors may perform well at detecting proximity at close distances but may have issues detecting proximity at larger distances since a small capacitance and/or a small change to capacitance may be indistinguishable from noise. Some capacitive proximity sensors may define an arbitrary noise threshold level under which a capacitance signal is considered noise, which may limit the distance at which proximity detection can be reliable.

The present disclosure is generally directed to various systems and methods for improving capacitive proximity sensing and detection. In some embodiments, these systems and methods may use a switch to periodically connect an internal sensing plate of a capacitive proximity sensor to a reference capacitor with a reference capacitance ($C_{ref}$). The switch may place the reference capacitance in a parallel configuration with the internal sensing plate, and any capacitance measured above the value of $C_{ref}$ may be used for proximity sensing. Switching between an internal sensing plate and a reference capacitance may produce a dithered output or signal. In some embodiments, measured capacitances may have large 1/f noise at low frequencies, and a high-pass filter may be used to attenuate this noise component. In certain embodiments, the systems and methods disclosed herein may include a synchronous detector to boost signal-to-noise ratios further. By using a reference capacitance rather than an arbitrary noise threshold level, these systems and methods may improve the reliability of proximity sensing at short distances and enable reliable proximity sensing at greater distances. These systems and methods may also enable detecting varying levels of proximity, hovering gesture detection, touch-like interaction through an intermediate material (e.g., clothing), and/or seamless transitions between touch and hover detection.

By improving the precision and reliability of proximity detection, systems and methods described herein represent an improvement to proximity-sensing systems. In addition, in some embodiments, these systems and methods may represent an improvement to devices that integrate proximity detection systems—e.g., by improving the user interface of such devices. Furthermore, these systems and methods may represent an improvement to the field of user interfaces.

Features from any of the embodiments described herein may be used in combination with one another in accordance with the general principles described herein. These and other embodiments, features, and advantages will be more fully understood upon reading the following detailed description in conjunction with the accompanying drawings and claims.

Figure 2:
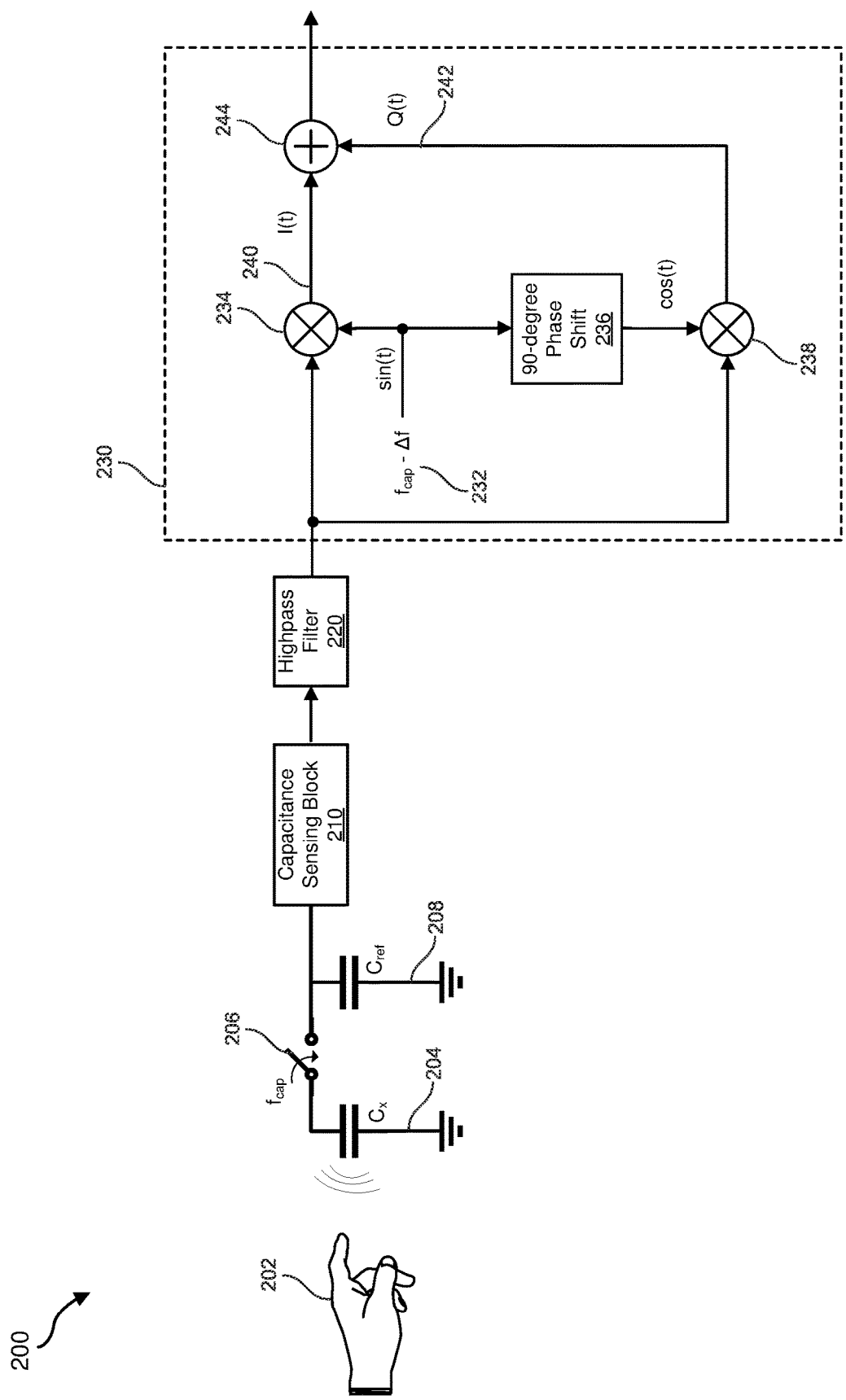
FIG. 2 is a block diagram of an exemplary proximity-sensing system according to embodiments of this disclosure.
Figure 3:
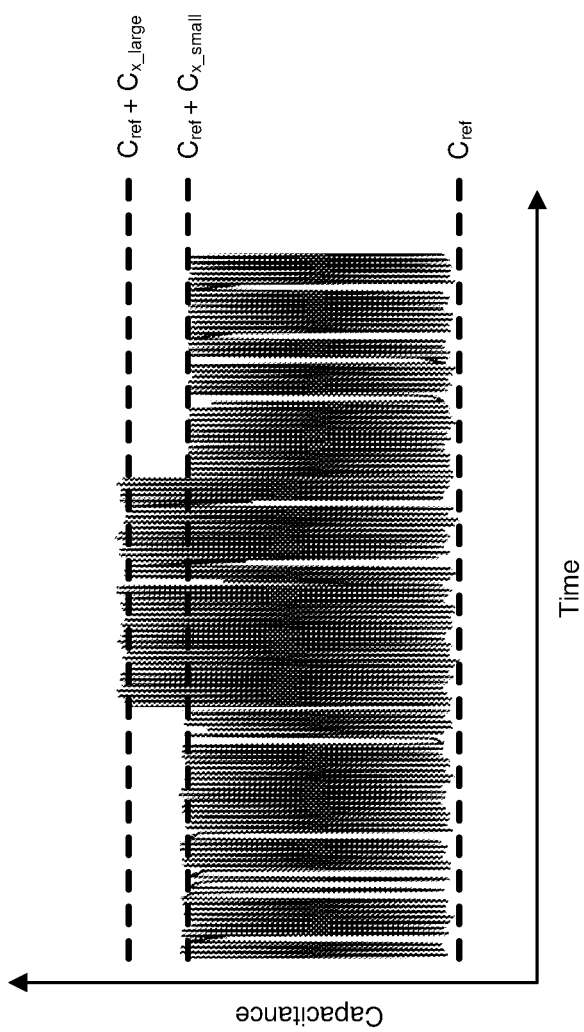
FIG. 3 is an illustration of an exemplary output of the proximity-sensing system of FIGS. 1 and/or 2 according to embodiments of this disclosure.
Figure 4:
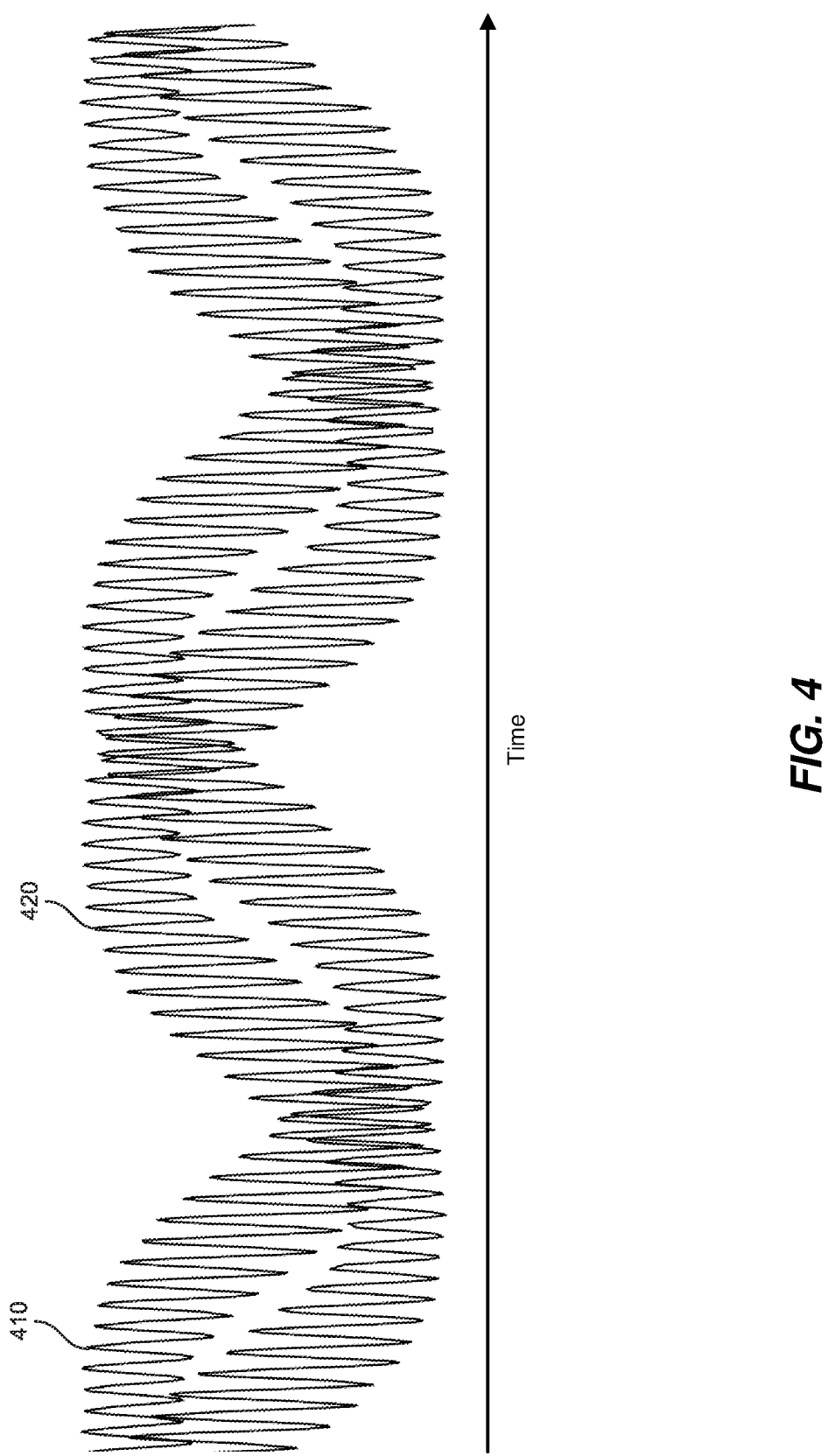
FIG. 4 is an illustration of other exemplary outputs of the proximity-sensing system of FIGS. 1 and/or 2 according to embodiments of this disclosure.
Figure 5:
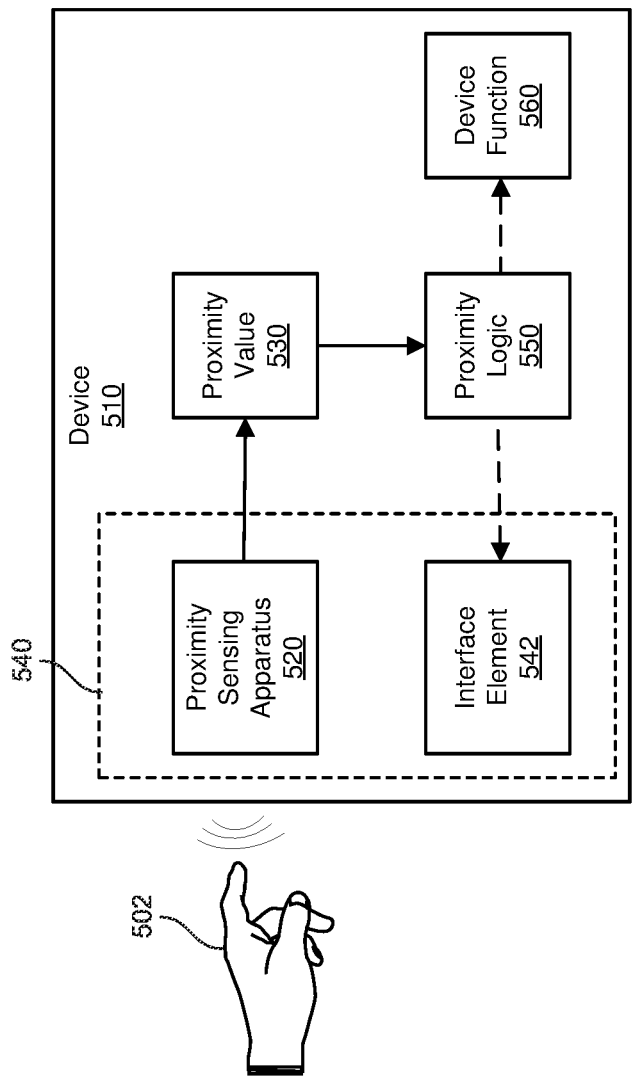
FIG. 5 is a block diagram of an exemplary device that integrates the proximity-sensing system of FIGS. 1 and/or 2 according to embodiments of this disclosure.
Figure 6B:
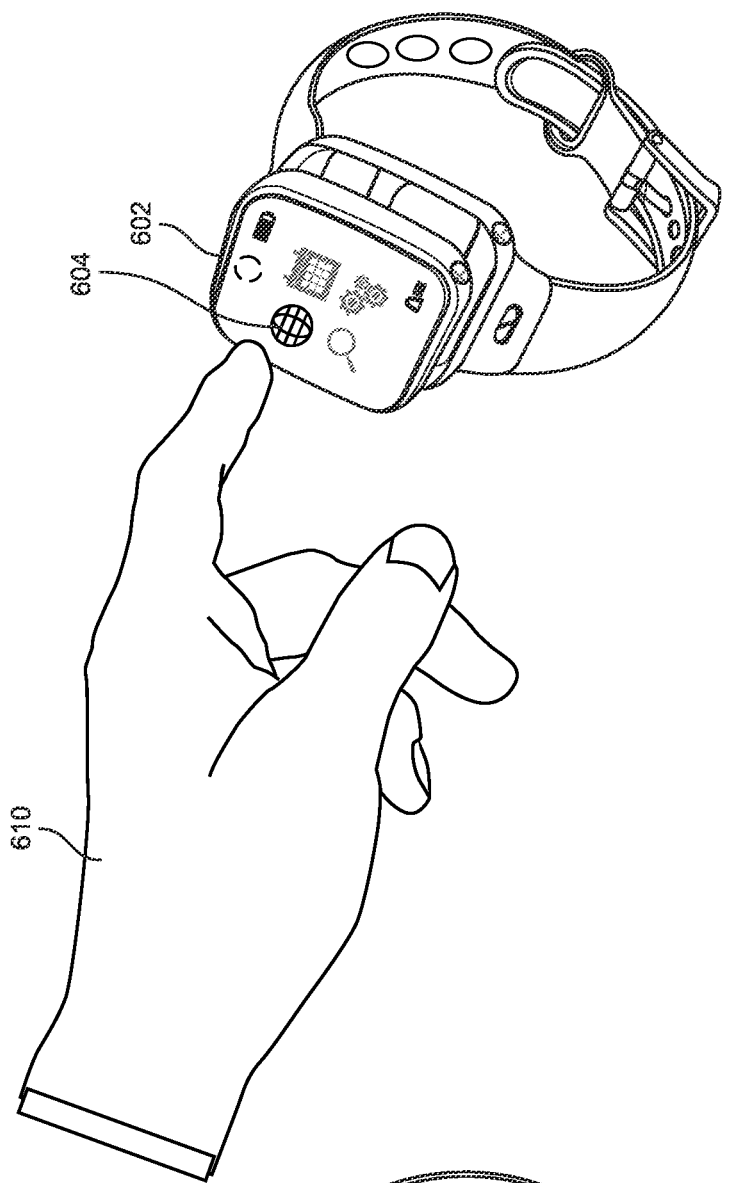
FIGS. 6A and 6B are illustrations of an exemplary device that integrates the proximity-sensing system of FIGS. 1 and/or 2 according to embodiments of this disclosure.
Figure 6A:
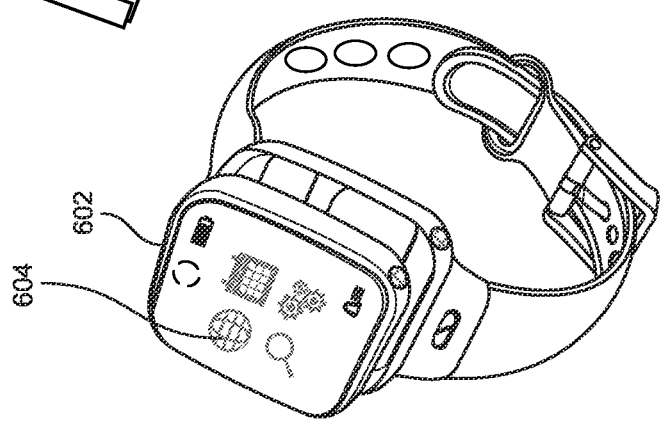
Figure 7:
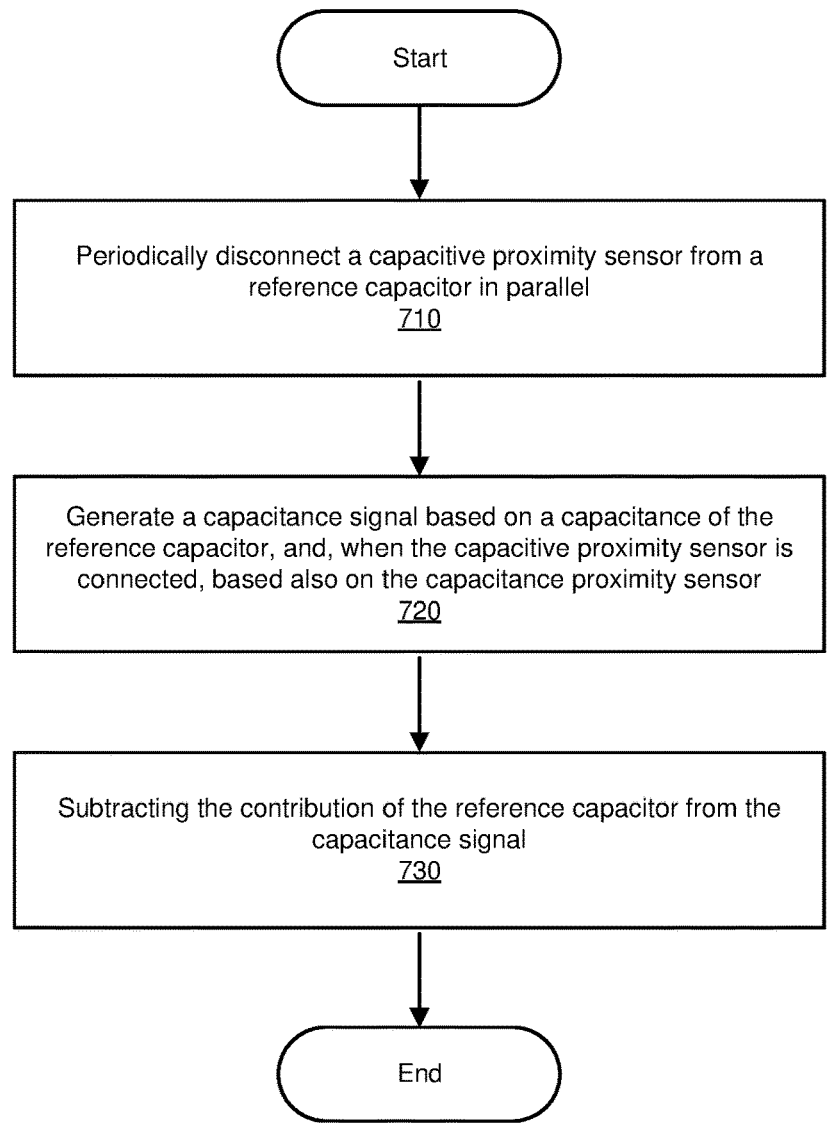
FIG. 7 is a flow diagram of an exemplary method for variable-distance proximity detection.
Figure 8:
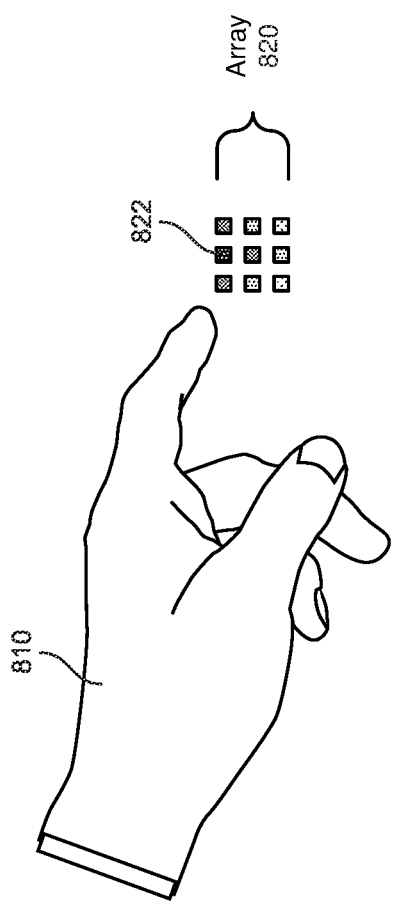
FIG. 8 is an illustration of an exemplary array of proximity-sensing systems.

The following will provide, with reference to FIGS. 1-2, detailed descriptions of exemplary proximity-sensing systems; with reference to FIGS. 3-4, detailed descriptions of exemplary outputs of proximity-sensing systems; with reference to FIGS. 5-6, detailed descriptions of exemplary devices incorporating proximity-sensing systems; with reference to FIG. 7, detailed descriptions of an exemplary method for variable-distance proximity sensing; with reference to FIG. 8, detailed descriptions of an exemplary array of proximity-sensing systems; with reference to FIGS. 9-15, detailed descriptions of various systems and devices that may incorporate, interoperate with, and/or consume output from proximity-sensing systems.

FIG. 1 is a diagram of an exemplary proximity-sensing system 100. As shown in in FIG. 1, a hand 102 (or another capacitance-influence object) may interact with an electric field of a capacitive proximity sensor 110, contributing to a capacitance in proximity-sensing system 100 that may be sensed by a capacitance sensing block 140 when capacitive proximity sensor 110 is connected to a reference capacitor 130. A switch 120 may periodically connect capacitive proximity sensor 110 to reference capacitor 130. Reference capacitor 130 may constantly contribute to the capacitance in proximity-sensing system 100 that is sensed by capacitance sensing block 140. As will be explained in greater detail below, reference capacitor 130 may provide a baseline capacitance level. Systems described herein may subtract the capacitance contributed by reference capacitor 130 from the capacitance sensed by capacitance sensing block 140 to determine the capacitance caused by the proximity of hand 102.

Reference capacitor 130 may have a known, reliable, steady, and/or precise capacitance (e.g., with a tolerance variation of 5% or less, a tolerance variation of 2% or less, and/or a tolerance variation of 1% or less). Furthermore, as may be appreciated, systems described herein may determine if the capacitance of reference capacitor 130 shifts over time by sampling the capacitance observed by capacitance sensing block 140 when switch 120 is in a disconnected state. These systems may then use the new, observed capacitance value (e.g., sampled repeatedly over a period of time) of reference capacitor 130 when determining the contribution of hand 102 and capacitive proximity sensor 110 to the capacitance sensed by capacitance sensing block 140.

As shown in FIG. 1, proximity-sensing system 100 may also include a synchronous detector 150. In some examples, synchronous detector 150 may act as a bandpass filter and attenuate frequencies of the signal from capacitance sensing block 140 that fall outside of the frequency at which switch 120 switches. Synchronous detector 150 may thereby produce a proximity signal 160 that indicates a proximity of hand 102 to capacitive proximity sensor 110.

FIG. 2 is a block diagram of an exemplary proximity-sensing system 200. In one embodiment, FIG. 2 may be a more detailed view of proximity-sensing system 100 of FIG. 1. Some or all of the proximity-sensing elements shown in FIG. 2 may be incorporated into an electronic device (e.g., a virtual-reality device, an augmented-reality device, a wearable device, or any of the other devices described herein) for enabling proximity sensing (e.g., as a capacitive proximity sensor). As shown, a hand 202 (or another capacitance-influencing object) may interact with an electric field of proximity-sensing system 200. A capacitance ($C_x$) (e.g., a capacitance or change in capacitance that is caused by the hand and measured relative to one or more internal sensing plates or antennae, such as a capacitive proximity sensor 204) may be small when the hand is not present and may increase with increasing proximity of the hand.

A switch 206 may be used to periodically connect $C_x$ to a reference capacitance ($C_{ref}$) at a frequency of $f_{cap}$. In some embodiments, $f_{cap}$ may be a multiple of a sampling rate of proximity-sensing system 200 and/or otherwise set based on a target response rate of proximity-sensing system 200. In at least one example, $f_{cap}$ may be any suitable frequency in a range of about 1 kHz to 100 kHz, a range of about 1 kHz to 10 kHz, a range of about 2 kHz to 20 kHz, a range of about 1 kHz to 4 kHz, a range of about 2 kHz to 4 kHz, a range of about 2.5 kHz to 3.5 kHz, or a range of about 2.75 kHz to 3.25 kHz. In at least one embodiment, $f_{cap}$ may be equal to 3 kHz. In some embodiments, the illustrated switched capacitor network ($C_x$ and $C_{ref}$) may be connected at the input of a capacitance sensing block 210 as shown. In some examples, $f_{cap}$ may be a fixed, consistent frequency. In at least one embodiment, systems described herein may adjust $f_{cap}$ in response to adjusting and/or in order to adjust a target response rate of proximity-sensing system 200.

FIG. 3 is an illustration of an exemplary output of the exemplary capacitance sensing block in FIG. 2. In this illustration, the value $C_{ref}$ may be any suitable reference capacitance. $C_{x\_small}$ may represent a small increased capacitance caused when hand 202 (or another capacitance-influencing object) is near proximity-sensing system 200 (or, e.g., near capacitive proximity sensor 204) and $C_{x\_large}$ may represent a larger increased capacitance caused when the hand temporarily comes nearer to proximity-sensing system 200. $C_{x\_small}$ and $C_{x\_large}$ may be easily measured and/or discerned by subtracting the known value $C_{ref}$ from the total measured capacitance measured by capacitance sensing block 210. In some embodiments, an output of capacitance sensing block 210 may be used for generating proximity detection and measurement output signals. In some embodiments, the output of capacitance sensing block 210 may have a large 1/f noise at low frequencies, and a highpass filter 220 may be used to attenuate this noise component (e.g., as shown in FIG. 2).

Returning to FIG. 2, in some embodiments, the output of highpass filter 220 (or the output of capacitance sensing block 210 or another processed output derived from the output of capacitance sensing block 210) may be provided to a synchronous detector 230 and may be mixed and/or multiplied together with a signal 232 (e.g., a single frequency sinewave that has as a frequency at or slightly lower than the switched capacitor frequency) by a mixer 234, thus producing an output 240 representing an in-phase waveform I(t). The sinewave may also undergo a 90-degree phase shift 236, and the resulting waveform may be mixed and/or multiplied together with the highpass filter output (or the output of the capacitance sensing block) by a mixer 238, thus producing an output 242 representing a quadrature waveform Q(t). FIG. 4 provides an illustration of an exemplary in-phase waveform 410 and an exemplary corresponding quadrature waveform 420.

As mentioned above, signal 232 may have a frequency at or slightly lower than the switched capacitor frequency. The difference between the switched capacitor frequency and the frequency of signal 232 is shown in FIG. 2 as $\Delta f$. The selection of $\Delta f$ may be sufficiently small to still attenuate frequencies other than $f_{cap}$ and/or provide gain to the proximity signal while improving the response time of proximity signal to actual proximity events. In some examples, $\Delta f$ may be a fixed value. In some embodiments, systems described herein may adjust $\Delta f$ to either improve the gain of the proximity signal or to improve the responsiveness of proximity-sensing system 200.

In some embodiments, the output of capacitance sensing block 210 (and/or the output of one or more filters that refine the output of capacitance sensing block 210), sometimes referred to herein as a "capacitance signal," may be used for generating proximity detection and measurement output signals. In some embodiments, the output of proximity-sensing system 200 may be the sum of I(t) and Q(t) (e.g., the sum being performed by a component 244). I(t) and Q(t) may be orthogonal functions, and the output of proximity-sensing system 200 may be a vector sum. The amplitude of the output waveform may increase/decrease with increasing/decreasing proximity of a hand (or another capacitance-influencing object). In some embodiments, the output waveform of proximity-sensing system 200 may be the final output of proximity-sensing system 200 and/or may be used to generate additional proximity detection and measurement output signals. The output waveform and/or the additional proximity detection and measurement output signals may sometimes be referred to herein as a "proximity signal." Though not pictured, proximity-sensing system 200 may include an interface that provides the proximity signal to a device (e.g., to a device within which proximity-sensing system 200 is integrated).

FIG. 5 in an illustration of an exemplary device 510 that integrates a proximity-sensing apparatus 520 (e.g., corresponding to proximity sensing system 100 of FIG. 1 and/or proximity-sensing system 200 of FIG. 2). As shown in FIG. 5, proximity-sensing apparatus 520 may produce a signal interpretable as a proximity value 530 that describes a proximity of a hand 502 (e.g., the tip of a finger) or another capacitance-influencing object. Device 510 may be configured to apply proximity value 530 to a proximity logic 550 (e.g., implemented by a circuit, a microcontroller, and/or one or more computer-executable instructions loaded into a memory and executed by one or more processors). In one example, proximity logic 550 may alter an interface element 542 of an interface 540 in response to proximity value 530. For example, as a user's finger nears interface 540 (e.g., a touchscreen) of device 510, device 510 may highlight, animate, and/or otherwise indicate interface element 542 (e.g., an icon) that corresponds to the location of proximity sensing apparatus 520. In another example, proximity logic 550 may perform and/or execute a device function 560 on device 510 in response to proximity value 530. For example, device function 560 may wake the device and/or interpret a gesture of hand 502 to apply a gesture-based input to device 510. In some examples, device 510 may perform different functions at different values for proximity value 530. For example, proximity logic 550 may implement varying changes to interface element 542 at different levels of proximity.

FIGS. 6A and 6B illustrate an exemplary smartwatch 602 that integrates one or more proximity-sensing apparatuses. As shown in FIGS. 6A and 6B, smartwatch 602 may have a touchscreen interface displaying icons, including an icon 604. Due to the relatively small size of the touchscreen of smartwatch 602, when a finger of hand 610 nears the touchscreen of smartwatch 602, it may ordinarily be difficult for a user to be certain with precision where a touch input will land. To help the user interact with smartwatch 602 with accuracy and confidence, a proximity-sensing apparatus may sense that the user's finger is close to icon 604 (such that, if the user's finger touches the touchscreen, it is most likely to touch icon 604). Accordingly, an interface system of smartwatch 602 may include logic to highlight icon 604 as the proximity-sensing apparatus detects that the user is near to touching icon 604. This may indicate to the user the actual target of the user's near touch. The user may then touch icon 604 with confidence if that is the user's intention or adjust the approach of hand 610 to touch a different icon if a different icon was intended.

FIG. 7 is a flow diagram of an exemplary method 700 for variable-distance proximity detection. The steps shown in FIG. 7 may be performed by any combination of hardware and software including, e.g., a circuit, a microcontroller, and/or a processor and memory configure with one or more computer-executable instructions. In one example, each of the steps shown in FIG. 7 may represent an algorithm whose structure includes and/or is represented by multiple sub-steps.

As illustrated in FIG. 7, at step 710 one or more of the systems described herein may periodically disconnect a capacitive proximity sensor from a reference capacitor in parallel. For example, a switch may be configured to open and close a connection between the capacitive proximity sensor and the reference capacitor at a specified frequency. In some examples, the switch may be capable of switching at different frequencies, and an input to the switch may alter the switch frequency to adjust the sensitivity, responsiveness, and/or accuracy of a proximity detection system.

At step 720 one or more of the systems described herein may generate a capacitance signal based on a capacitance of the reference capacitor, and, when the capacitive proximity sensor is connected, based also on the capacitive proximity sensor. Thus, for example, when the capacitive proximity sensor is disconnected from the reference capacitor (e.g., due to the state of the intervening switch), the systems described herein may generate the capacitance signal based only on the detected capacitance (e.g., from the reference capacitor). However, when the capacitive proximity sensor is connected to the reference capacitor (e.g., in parallel), the capacitive proximity sensor may contribute to the capacitance signal.

At step 730 or one or more of the systems described herein may subtract the contribution of the reference capacitor from the capacitance signal. These systems may determine the contribution of the reference capacitor in any suitable manner. For example, the capacitance of the reference capacitor may be known (and, e.g., the tolerance variation of the reference capacitor may be known to be low). Accordingly, these systems may subtract the known capacitance of the reference capacitor. In another example, the capacitance of the reference capacitor may be sampled (e.g., during a calibration procedure and/or periodically) while the capacitive proximity sensor is disconnected from the reference capacitor. In some examples, the systems described herein may change the amount of capacitance that is attributed to the reference capacitor after sampling capacitance over time and consistently identifying a drift from the original capacitance of the reference capacitor.

FIG. 8 illustrates an exemplary array 820 of proximity-sensing systems. In some examples, systems described herein may use and/or integrate multiple proximity-sensing systems to contribute to determining and/or refining the determination of a single proximity event and/or value. For example, as a hand 810 approaches proximity-sensing system 822, proximity-sensing system 822 may generate a proximity signal and/or value indicating, with a level of accuracy and precision, the proximity of the finger of hand 810 to proximity-sensing system 822. However, to improve the accuracy and precision of proximity detection, systems described herein may use and incorporate the signals of adjacent and/or nearby proximity-sensing systems (such as those in array 820). Thus, for example, systems described herein may determine with more precision and/or accuracy how close hand 810 is to proximity-sensing system 822 by determining how close hand 810 is to other proximity-sensing systems in array 820.

Additionally or alternatively, systems described herein may determine not only the distance but also the direction of hand 810 from proximity-sensing system 822 based on the proximity of hand 810 to other proximity-sensing systems in array 820 (e.g., a relatively weaker proximity signal in the proximity-sensing system to the right of system 822 and/or a relatively stronger proximity signal in the proximity-sensing system to the left of system 822 may indicate that hand 810 is off-center to the left of proximity-sensing system 822, even if proximity-sensing system 822 shows the strongest proximity signal and thus the greatest proximity to hand 810).

In another example, neighboring proximity-sensing systems in array 820 may validate and/or invalidate the proximity signal of a proximity-sensing system in array 820. For example, if proximity-sensing system 822 produces a signal indicating close proximity but none of the adjacent proximity-sensing systems show a signal indicating comparable proximity, systems described herein may disregard the signal from proximity-sensing system 822 as noise (and, if the phenomenon persists over time, may cease to use the signal from proximity-sensing system 822). Conversely, if proximity-sensing system 822 momentarily produces a signal indicating a lack of proximity but all of the adjacent proximity-sensing systems show a signal indicating close proximity, systems described herein may treat the momentary weak proximity signal as an aberration rather than as representing the true proximity of hand 810.

As a further example, neighboring proximity-sensing systems in array 820 may provide additional data to more precisely and accurately estimate the proximity of hand 810 to proximity-sensing system 822. For example, each proximity-sensing system in array 820 may produce a respective proximity signal. Systems described herein may use each of the respective proximity signals to independently estimate where hand 810 (i.e., the near fingertip of hand 810) may be in three-dimensional space (e.g., described by the surface of a sphere or a hemisphere with the given proximity-sensing system describing the center and the gauged proximity describing the radius). These systems may then determine a best fit for the location of hand 810 in three-dimensional space given the estimates of the various proximity-sensing systems. These systems may then use the estimated location to determine the proximity of hand 810 to any location (e.g., a particular proximity-sensing system in array 820 and/or an arbitrary location, such as an icon displayed on a touchscreen with which array 820 is integrated).

Example Embodiments

Example 1: An apparatus may include a capacitive proximity sensor that increases capacitance in response to proximity of an object; a reference capacitor in parallel with the capacitive proximity sensor; a switch that connects and disconnects the capacitive proximity sensor and the reference capacitor; and a capacitance sensing block that generates a capacitance signal based on a capacitance of the reference capacitor when the switch is in a disconnecting state and based on the capacitance of the reference capacitor and a capacitance of the capacitive proximity sensor when the switch is in a connecting state.

Example 2: The apparatus of Example 1, where the reference capacitor produces a baseline capacitance level beyond which capacitance sensed by the capacitance sensing block is attributable to capacitance from proximity of an object to the capacitive proximity sensor.

Example 3: The apparatus of any of Examples 1 and 2, further including an interface that provides, as output, a proximity signal indicating the proximity of the object.

Example 4: The apparatus of any of Examples 1-3, where the proximity signal indicates a proximity of the object absent contact between the object and a surface of the apparatus proximate to the capacitive proximity sensor.

Example 4: The apparatus of any of Examples 1-3, where the proximity signal indicates a proximity of the object absent contact between the object and a surface of the apparatus proximate to the capacitive proximity sensor.

Example 5: The apparatus of any of Examples 1-4, where the proximity signal indicates a degree of the proximity of the object within a predetermined range of distances.

Example 6: The apparatus of any of Examples 1-5, further including a highpass filter that modifies the capacitance signal by attenuating a 1/f noise of the capacitance signal.

Example 7: The apparatus of any of Examples 1-6, where the switch periodically switches between the connecting state and the disconnecting state.

Example 8: The apparatus of any of Examples 1-7, further including a synchronous detector that receives the capacitance signal and that is synchronized based on a frequency at which the switch periodically switches.

Example 9: The apparatus of any of Examples 1-8, where the synchronous detector is synchronized to a lower frequency than the frequency at which the switch periodically switches, the lower frequency being lower than the frequency by a predetermined amount.

Example 10: The apparatus of any of Examples 1-9, where the synchronous detector produces a signal with an in-phase and quadrature component of the capacitance signal.

Embodiments of the present disclosure may include or be implemented in conjunction with various types of artificial-reality systems. Artificial reality is a form of reality that has been adjusted in some manner before presentation to a user, which may include, for example, a virtual reality, an augmented reality, a mixed reality, a hybrid reality, or some combination and/or derivative thereof. Artificial-reality content may include completely computer-generated content or computer-generated content combined with captured (e.g., real-world) content. The artificial-reality content may include video, audio, haptic feedback, or some combination thereof, any of which may be presented in a single channel or in multiple channels (such as stereo video that produces a three-dimensional (3D) effect to the viewer). Additionally, in some embodiments, artificial reality may also be associated with applications, products, accessories, services, or some combination thereof, that are used to, for example, create content in an artificial reality and/or are otherwise used in (e.g., to perform activities in) an artificial reality.

Artificial-reality systems may be implemented in a variety of different form factors and configurations. Some artificial-reality systems may be designed to work without near-eye displays (NEDs). Other artificial-reality systems may include an NED that also provides visibility into the real world (such as, e.g., augmented-reality system 900 in FIG. 9) or that visually immerses a user in an artificial reality (such as, e.g., virtual-reality system 1000 in FIG. 10). While some artificial-reality devices may be self-contained systems, other artificial-reality devices may communicate and/or coordinate with external devices to provide an artificial-reality experience to a user. Examples of such external devices include handheld controllers, mobile devices, desktop computers, devices worn by a user, devices worn by one or more other users, and/or any other suitable external system.

Figure 9:
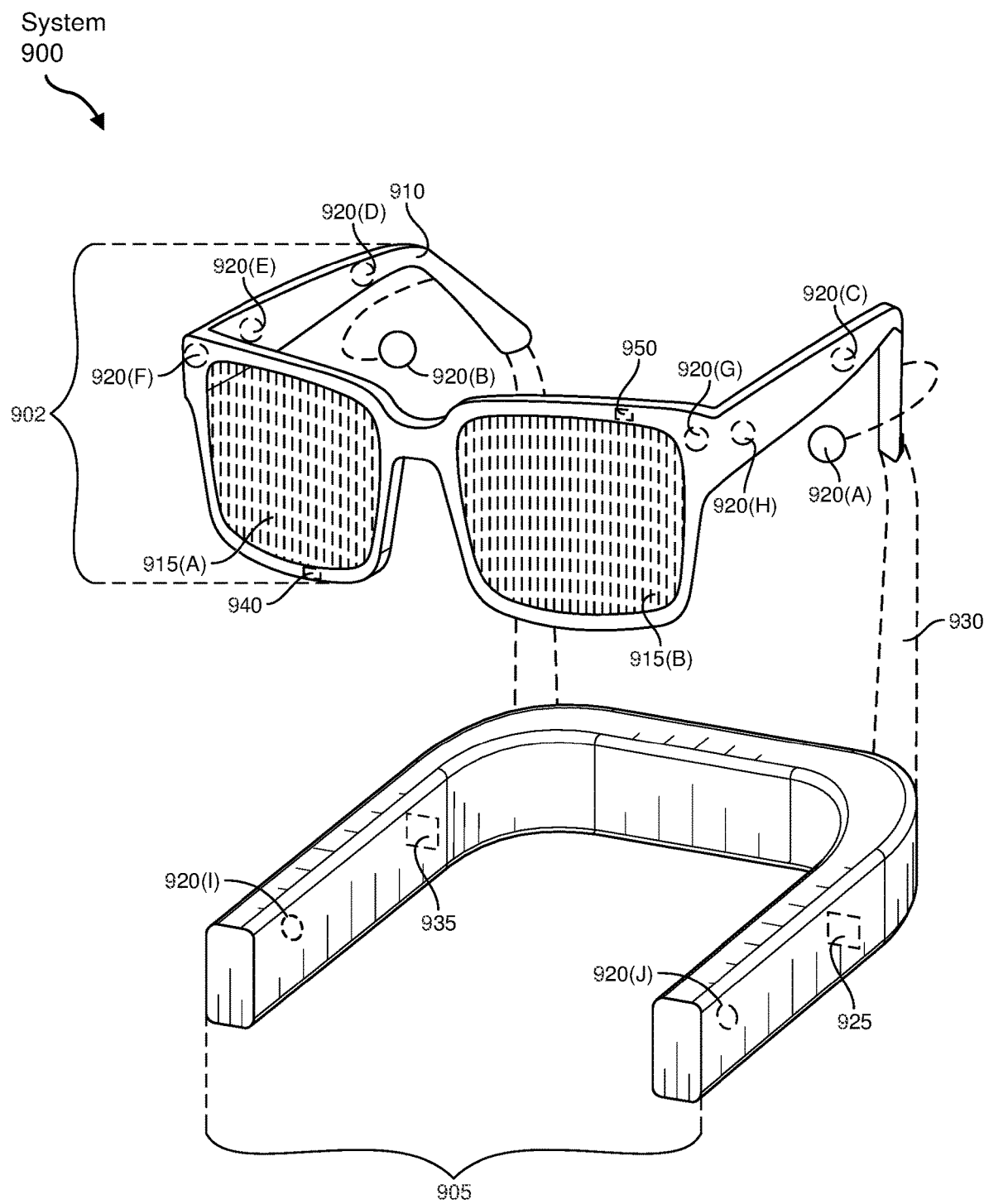
FIG. 9 is an illustration of exemplary augmented-reality glasses that may be used in connection with embodiments of this disclosure.

Turning to FIG. 9, augmented-reality system 900 may include an eyewear device 902 with a frame 910 configured to hold a left display device 915(A) and a right display device 915(B) in front of a user's eyes. Display devices 915(A) and 915(B) may act together or independently to present an image or series of images to a user. While augmented-reality system 900 includes two displays, embodiments of this disclosure may be implemented in augmented-reality systems with a single NED or more than two NEDs.

In some embodiments, augmented-reality system 900 may include one or more sensors, such as sensor 940. Sensor 940 may generate measurement signals in response to motion of augmented-reality system 900 and may be located on substantially any portion of frame 910. Sensor 940 may represent one or more of a variety of different sensing mechanisms, such as a position sensor, an inertial measurement unit (IMU), a depth camera assembly, a structured light emitter and/or detector, or any combination thereof. In some embodiments, augmented-reality system 900 may or may not include sensor 940 or may include more than one sensor. In embodiments in which sensor 940 includes an IMU, the IMU may generate calibration data based on measurement signals from sensor 940. Examples of sensor 940 may include, without limitation, accelerometers, gyroscopes, magnetometers, other suitable types of sensors that detect motion, sensors used for error correction of the IMU, or some combination thereof.

In some examples, augmented-reality system 900 may also include a microphone array with a plurality of acoustic transducers 920(A)-920(J), referred to collectively as acoustic transducers 920. Acoustic transducers 920 may represent transducers that detect air pressure variations induced by sound waves. Each acoustic transducer 920 may be configured to detect sound and convert the detected sound into an electronic format (e.g., an analog or digital format). The microphone array in FIG. 9 may include, for example, ten acoustic transducers: 920(A) and 920(B), which may be designed to be placed inside a corresponding ear of the user, acoustic transducers 920(C), 920(D), 920(E), 920(F), 920 (G), and 920(H), which may be positioned at various locations on frame 910, and/or acoustic transducers 920(I) and 920(J), which may be positioned on a corresponding neckband 905.

In some embodiments, one or more of acoustic transducers 920(A)-(J) may be used as output transducers (e.g., speakers). For example, acoustic transducers 920(A) and/or 920(B) may be earbuds or any other suitable type of headphone or speaker.

The configuration of acoustic transducers 920 of the microphone array may vary. While augmented-reality system 900 is shown in FIG. 9 as having ten acoustic transducers 920, the number of acoustic transducers 920 may be greater or less than ten. In some embodiments, using higher numbers of acoustic transducers 920 may increase the amount of audio information collected and/or the sensitivity and accuracy of the audio information. In contrast, using a lower number of acoustic transducers 920 may decrease the computing power required by an associated controller 950 to process the collected audio information. In addition, the position of each acoustic transducer 920 of the microphone array may vary. For example, the position of an acoustic transducer 920 may include a defined position on the user, a defined coordinate on frame 910, an orientation associated with each acoustic transducer 920, or some combination thereof.

Acoustic transducers 920(A) and 920(B) may be positioned on different parts of the user's ear, such as behind the pinna, behind the tragus, and/or within the auricle or fossa. Or, there may be additional acoustic transducers 920 on or surrounding the ear in addition to acoustic transducers 920 inside the ear canal. Having an acoustic transducer 920 positioned next to an ear canal of a user may enable the microphone array to collect information on how sounds arrive at the ear canal. By positioning at least two of acoustic transducers 920 on either side of a user's head (e.g., as binaural microphones), augmented-reality device 900 may simulate binaural hearing and capture a 3D stereo sound field around about a user's head. In some embodiments, acoustic transducers 920(A) and 920(B) may be connected to augmented-reality system 900 via a wired connection 930, and in other embodiments acoustic transducers 920(A) and 920(B) may be connected to augmented-reality system 900 via a wireless connection (e.g., a BLUETOOTH connection). In still other embodiments, acoustic transducers 920(A) and 920(B) may not be used at all in conjunction with augmented-reality system 900.

Acoustic transducers 920 on frame 910 may be positioned in a variety of different ways, including along the length of the temples, across the bridge, above or below display devices 915(A) and 915(B), or some combination thereof. Acoustic transducers 920 may also be oriented such that the microphone array is able to detect sounds in a wide range of directions surrounding the user wearing the augmented-reality system 900. In some embodiments, an optimization process may be performed during manufacturing of augmented-reality system 900 to determine relative positioning of each acoustic transducer 920 in the microphone array.

In some examples, augmented-reality system 900 may include or be connected to an external device (e.g., a paired device), such as neckband 905. Neckband 905 generally represents any type or form of paired device. Thus, the following discussion of neckband 905 may also apply to various other paired devices, such as charging cases, smart watches, smart phones, wrist bands, other wearable devices, hand-held controllers, tablet computers, laptop computers, other external compute devices, etc.

As shown, neckband 905 may be coupled to eyewear device 902 via one or more connectors. The connectors may be wired or wireless and may include electrical and/or non-electrical (e.g., structural) components. In some cases, eyewear device 902 and neckband 905 may operate independently without any wired or wireless connection between them. While FIG. 9 illustrates the components of eyewear device 902 and neckband 905 in example locations on eyewear device 902 and neckband 905, the components may be located elsewhere and/or distributed differently on eyewear device 902 and/or neckband 905. In some embodiments, the components of eyewear device 902 and neckband 905 may be located on one or more additional peripheral devices paired with eyewear device 902, neckband 905, or some combination thereof.

Pairing external devices, such as neckband 905, with augmented-reality eyewear devices may enable the eyewear devices to achieve the form factor of a pair of glasses while still providing sufficient battery and computation power for expanded capabilities. Some or all of the battery power, computational resources, and/or additional features of augmented-reality system 900 may be provided by a paired device or shared between a paired device and an eyewear device, thus reducing the weight, heat profile, and form factor of the eyewear device overall while still retaining desired functionality. For example, neckband 905 may allow components that would otherwise be included on an eyewear device to be included in neckband 905 since users may tolerate a heavier weight load on their shoulders than they would tolerate on their heads. Neckband 905 may also have a larger surface area over which to diffuse and disperse heat to the ambient environment. Thus, neckband 905 may allow for greater battery and computation capacity than might otherwise have been possible on a stand-alone eyewear device. Since weight carried in neckband 905 may be less invasive to a user than weight carried in eyewear device 902, a user may tolerate wearing a lighter eyewear device and carrying or wearing the paired device for greater lengths of time than a user would tolerate wearing a heavy standalone eyewear device, thereby enabling users to more fully incorporate artificial-reality environments into their day-to-day activities.

Neckband 905 may be communicatively coupled with eyewear device 902 and/or to other devices. These other devices may provide certain functions (e.g., tracking, localizing, depth mapping, processing, storage, etc.) to augmented-reality system 900. In the embodiment of FIG. 9, neckband 905 may include two acoustic transducers (e.g., 920(I) and 920(J)) that are part of the microphone array (or potentially form their own microphone subarray). Neckband 905 may also include a controller 925 and a power source 935.

Acoustic transducers 920(I) and 920(J) of neckband 905 may be configured to detect sound and convert the detected sound into an electronic format (analog or digital). In the embodiment of FIG. 9, acoustic transducers 920(I) and 920(J) may be positioned on neckband 905, thereby increasing the distance between the neckband acoustic transducers 920(I) and 920(J) and other acoustic transducers 920 positioned on eyewear device 902. In some cases, increasing the distance between acoustic transducers 920 of the microphone array may improve the accuracy of beamforming performed via the microphone array. For example, if a sound is detected by acoustic transducers 920(C) and 920(D) and the distance between acoustic transducers 920(C) and 920 (D) is greater than, e.g., the distance between acoustic transducers 920(D) and 920(E), the determined source location of the detected sound may be more accurate than if the sound had been detected by acoustic transducers 920(D) and 920(E).

Controller 925 of neckband 905 may process information generated by the sensors on neckband 905 and/or augmented-reality system 900. For example, controller 925 may process information from the microphone array that describes sounds detected by the microphone array. For each detected sound, controller 925 may perform a direction-of-arrival (DOA) estimation to estimate a direction from which the detected sound arrived at the microphone array. As the microphone array detects sounds, controller 925 may populate an audio data set with the information. In embodiments in which augmented-reality system 900 includes an inertial measurement unit, controller 925 may compute all inertial and spatial calculations from the IMU located on eyewear device 902. A connector may convey information between augmented-reality system 900 and neckband 905 and between augmented-reality system 900 and controller 925. The information may be in the form of optical data, electrical data, wireless data, or any other transmittable data form. Moving the processing of information generated by augmented-reality system 900 to neckband 905 may reduce weight and heat in eyewear device 902, making it more comfortable to the user.

Power source 935 in neckband 905 may provide power to eyewear device 902 and/or to neckband 905. Power source 935 may include, without limitation, lithium ion batteries, lithium-polymer batteries, primary lithium batteries, alkaline batteries, or any other form of power storage. In some cases, power source 935 may be a wired power source. Including power source 935 on neckband 905 instead of on eyewear device 902 may help better distribute the weight and heat generated by power source 935.

As noted, some artificial-reality systems may, instead of blending an artificial reality with actual reality, substantially replace one or more of a user's sensory perceptions of the real world with a virtual experience. One example of this type of system is a head-worn display system, such as virtual-reality system 1000 in FIG. 10, that mostly or completely covers a user's field of view. Virtual-reality system 1000 may include a front rigid body 1002 and a band 1004 shaped to fit around a user's head. Virtual-reality system 1000 may also include output audio transducers 1006(A) and 1006(B). Furthermore, while not shown in FIG. 10, front rigid body 1002 may include one or more electronic elements, including one or more electronic displays, one or more inertial measurement units (IMUS), one or more tracking emitters or detectors, and/or any other suitable device or system for creating an artificial-reality experience.

Artificial-reality systems may include a variety of types of visual feedback mechanisms. For example, display devices in augmented-reality system 900 and/or virtual-reality system 1000 may include one or more liquid crystal displays (LCDs), light emitting diode (LED) displays, microLED displays, organic LED (OLED) displays, digital light project (DLP) micro-displays, liquid crystal on silicon (LCoS) micro-displays, and/or any other suitable type of display screen. These artificial-reality systems may include a single display screen for both eyes or may provide a display screen for each eye, which may allow for additional flexibility for varifocal adjustments or for correcting a user's refractive error. Some of these artificial-reality systems may also include optical subsystems having one or more lenses (e.g., conventional concave or convex lenses, Fresnel lenses, adjustable liquid lenses, etc.) through which a user may view a display screen. These optical subsystems may serve a variety of purposes, including to collimate (e.g., make an object appear at a greater distance than its physical distance), to magnify (e.g., make an object appear larger than its actual size), and/or to relay (to, e.g., the viewer's eyes) light. These optical subsystems may be used in a non-pupil-forming architecture (such as a single lens configuration that directly collimates light but results in so-called pincushion distortion) and/or a pupil-forming architecture (such as a multi-lens configuration that produces so-called barrel distortion to nullify pincushion distortion).

In addition to or instead of using display screens, some of the artificial-reality systems described herein may include one or more projection systems. For example, display devices in augmented-reality system 900 and/or virtual-reality system 1000 may include micro-LED projectors that project light (using, e.g., a waveguide) into display devices, such as clear combiner lenses that allow ambient light to pass through. The display devices may refract the projected light toward a user's pupil and may enable a user to simultaneously view both artificial-reality content and the real world. The display devices may accomplish this using any of a variety of different optical components, including waveguide components (e.g., holographic, planar, diffractive, polarized, and/or reflective waveguide elements), light-manipulation surfaces and elements (such as diffractive, reflective, and refractive elements and gratings), coupling elements, etc. Artificial-reality systems may also be configured with any other suitable type or form of image projection system, such as retinal projectors used in virtual retina displays.

The artificial-reality systems described herein may also include various types of computer vision components and subsystems. For example, augmented-reality system 900 and/or virtual-reality system 1000 may include one or more optical sensors, such as two-dimensional (2D) or 3D cameras, structured light transmitters and detectors, time-of-flight depth sensors, single-beam or sweeping laser rangefinders, 3D LiDAR sensors, and/or any other suitable type or form of optical sensor. An artificial-reality system may process data from one or more of these sensors to identify a location of a user, to map the real world, to provide a user with context about real-world surroundings, and/or to perform a variety of other functions.

The artificial-reality systems described herein may also include one or more input and/or output audio transducers. Output audio transducers may include voice coil speakers, ribbon speakers, electrostatic speakers, piezoelectric speakers, bone conduction transducers, cartilage conduction transducers, tragus-vibration transducers, and/or any other suitable type or form of audio transducer. Similarly, input audio transducers may include condenser microphones, dynamic microphones, ribbon microphones, and/or any other type or form of input transducer. In some embodiments, a single transducer may be used for both audio input and audio output.

In some embodiments, the artificial-reality systems described herein may also include tactile (i.e., haptic) feedback systems, which may be incorporated into headwear, gloves, body suits, handheld controllers, environmental devices (e.g., chairs, floormats, etc.), and/or any other type of device or system. Haptic feedback systems may provide various types of cutaneous feedback, including vibration, force, traction, texture, and/or temperature. Haptic feedback systems may also provide various types of kinesthetic feedback, such as motion and compliance. Haptic feedback may be implemented using motors, piezoelectric actuators, fluidic systems, and/or a variety of other types of feedback mechanisms. Haptic feedback systems may be implemented independent of other artificial-reality devices, within other artificial-reality devices, and/or in conjunction with other artificial-reality devices.

By providing haptic sensations, audible content, and/or visual content, artificial-reality systems may create an entire virtual experience or enhance a user's real-world experience in a variety of contexts and environments. For instance, artificial-reality systems may assist or extend a user's perception, memory, or cognition within a particular environment. Some systems may enhance a user's interactions with other people in the real world or may enable more immersive interactions with other people in a virtual world. Artificial-reality systems may also be used for educational purposes (e.g., for teaching or training in schools, hospitals, government organizations, military organizations, business enterprises, etc.), entertainment purposes (e.g., for playing video games, listening to music, watching video content, etc.), and/or for accessibility purposes (e.g., as hearing aids, visual aids, etc.). The embodiments disclosed herein may enable or enhance a user's artificial-reality experience in one or more of these contexts and environments and/or in other contexts and environments.

Some augmented-reality systems may map a user's and/or device's environment using techniques referred to as "simultaneous location and mapping" (SLAM). SLAM mapping and location identifying techniques may involve a variety of hardware and software tools that can create or update a map of an environment while simultaneously keeping track of a user's location within the mapped environment. SLAM may use many different types of sensors to create a map and determine a user's position within the map.

SLAM techniques may, for example, implement optical sensors to determine a user's location. Radios including WiFi, BLUETOOTH, global positioning system (GPS), cellular or other communication devices may be also used to determine a user's location relative to a radio transceiver or group of transceivers (e.g., a WiFi router or group of GPS satellites). Acoustic sensors such as microphone arrays or 2D or 3D sonar sensors may also be used to determine a user's location within an environment. Augmented-reality and virtual-reality devices (such as systems 900 and 1000 of FIGS. 9 and 10, respectively) may incorporate any or all of these types of sensors to perform SLAM operations such as creating and continually updating maps of the user's current environment. In at least some of the embodiments described herein, SLAM data generated by these sensors may be referred to as "environmental data" and may indicate a user's current environment. This data may be stored in a local or remote data store (e.g., a cloud data store) and may be provided to a user's AR/VR device on demand.

When the user is wearing an augmented-reality headset or virtual-reality headset in a given environment, the user may be interacting with other users or other electronic devices that serve as audio sources. In some cases, it may be desirable to determine where the audio sources are located relative to the user and then present the audio sources to the user as if they were coming from the location of the audio source. The process of determining where the audio sources are located relative to the user may be referred to as "localization," and the process of rendering playback of the audio source signal to appear as if it is coming from a specific direction may be referred to as "spatialization."

Localizing an audio source may be performed in a variety of different ways. In some cases, an augmented-reality or virtual-reality headset may initiate a DOA analysis to determine the location of a sound source. The DOA analysis may include analyzing the intensity, spectra, and/or arrival time of each sound at the artificial-reality device to determine the direction from which the sounds originated. The DOA analysis may include any suitable algorithm for analyzing the surrounding acoustic environment in which the artificial-reality device is located.

For example, the DOA analysis may be designed to receive input signals from a microphone and apply digital signal processing algorithms to the input signals to estimate the direction of arrival. These algorithms may include, for example, delay and sum algorithms where the input signal is sampled, and the resulting weighted and delayed versions of the sampled signal are averaged together to determine a direction of arrival. A least mean squared (LMS) algorithm may also be implemented to create an adaptive filter. This adaptive filter may then be used to identify differences in signal intensity, for example, or differences in time of arrival. These differences may then be used to estimate the direction of arrival. In another embodiment, the DOA may be determined by converting the input signals into the frequency domain and selecting specific bins within the time-frequency (TF) domain to process. Each selected TF bin may be processed to determine whether that bin includes a portion of the audio spectrum with a direct-path audio signal. Those bins having a portion of the direct-path signal may then be analyzed to identify the angle at which a microphone array received the direct-path audio signal. The determined angle may then be used to identify the direction of arrival for the received input signal. Other algorithms not listed above may also be used alone or in combination with the above algorithms to determine DOA.

In some embodiments, different users may perceive the source of a sound as coming from slightly different locations. This may be the result of each user having a unique head-related transfer function (HRTF), which may be dictated by a user's anatomy including ear canal length and the positioning of the ear drum. The artificial-reality device may provide an alignment and orientation guide, which the user may follow to customize the sound signal presented to the user based on their unique HRTF. In some embodiments, an artificial-reality device may implement one or more microphones to listen to sounds within the user's environment. The augmented-reality or virtual-reality headset may use a variety of different array transfer functions (e.g., any of the DOA algorithms identified above) to estimate the direction of arrival for the sounds. Once the direction of arrival has been determined, the artificial-reality device may play back sounds to the user according to the user's unique HRTF. Accordingly, the DOA estimation generated using the array transfer function (ATF) may be used to determine the direction from which the sounds are to be played from. The playback sounds may be further refined based on how that specific user hears sounds according to the HRTF.

In addition to or as an alternative to performing a DOA estimation, an artificial-reality device may perform localization based on information received from other types of sensors. These sensors may include cameras, IR sensors, heat sensors, motion sensors, GPS receivers, or in some cases, sensors that detect a user's eye movements. For example, as noted above, an artificial-reality device may include an eye tracker or gaze detector that determines where the user is looking. Often, the user's eyes will look at the source of the sound, if only briefly. Such clues provided by the user's eyes may further aid in determining the location of a sound source. Other sensors such as cameras, heat sensors, and IR sensors may also indicate the location of a user, the location of an electronic device, or the location of another sound source. Any or all of the above methods may be used individually or in combination to determine the location of a sound source and may further be used to update the location of a sound source over time.

Some embodiments may implement the determined DOA to generate a more customized output audio signal for the user. For instance, an "acoustic transfer function" may characterize or define how a sound is received from a given location. More specifically, an acoustic transfer function may define the relationship between parameters of a sound at its source location and the parameters by which the sound signal is detected (e.g., detected by a microphone array or detected by a user's ear). An artificial-reality device may include one or more acoustic sensors that detect sounds within range of the device. A controller of the artificial-reality device may estimate a DOA for the detected sounds (using, e.g., any of the methods identified above) and, based on the parameters of the detected sounds, may generate an acoustic transfer function that is specific to the location of the device. This customized acoustic transfer function may thus be used to generate a spatialized output audio signal where the sound is perceived as coming from a specific location.

Indeed, once the location of the sound source or sources is known, the artificial-reality device may re-render (i.e., spatialize) the sound signals to sound as if coming from the direction of that sound source. The artificial-reality device may apply filters or other digital signal processing that alter the intensity, spectra, or arrival time of the sound signal. The digital signal processing may be applied in such a way that the sound signal is perceived as originating from the determined location. The artificial-reality device may amplify or subdue certain frequencies or change the time that the signal arrives at each ear. In some cases, the artificial-reality device may create an acoustic transfer function that is specific to the location of the device and the detected direction of arrival of the sound signal. In some embodiments, the artificial-reality device may re-render the source signal in a stereo device or multi-speaker device (e.g., a surround sound device). In such cases, separate and distinct audio signals may be sent to each speaker. Each of these audio signals may be altered according to the user's HRTF and according to measurements of the user's location and the location of the sound source to sound as if they are coming from the determined location of the sound source. Accordingly, in this manner, the artificial-reality device (or speakers associated with the device) may re-render an audio signal to sound as if originating from a specific location.

As noted, artificial-reality systems 900 and 1000 may be used with a variety of other types of devices to provide a more compelling artificial-reality experience. These devices may be haptic interfaces with transducers that provide haptic feedback and/or that collect haptic information about a user's interaction with an environment. The artificial-reality systems disclosed herein may include various types of haptic interfaces that detect or convey various types of haptic information, including tactile feedback (e.g., feedback that a user detects via nerves in the skin, which may also be referred to as cutaneous feedback) and/or kinesthetic feedback (e.g., feedback that a user detects via receptors located in muscles, joints, and/or tendons).

Figure 11:
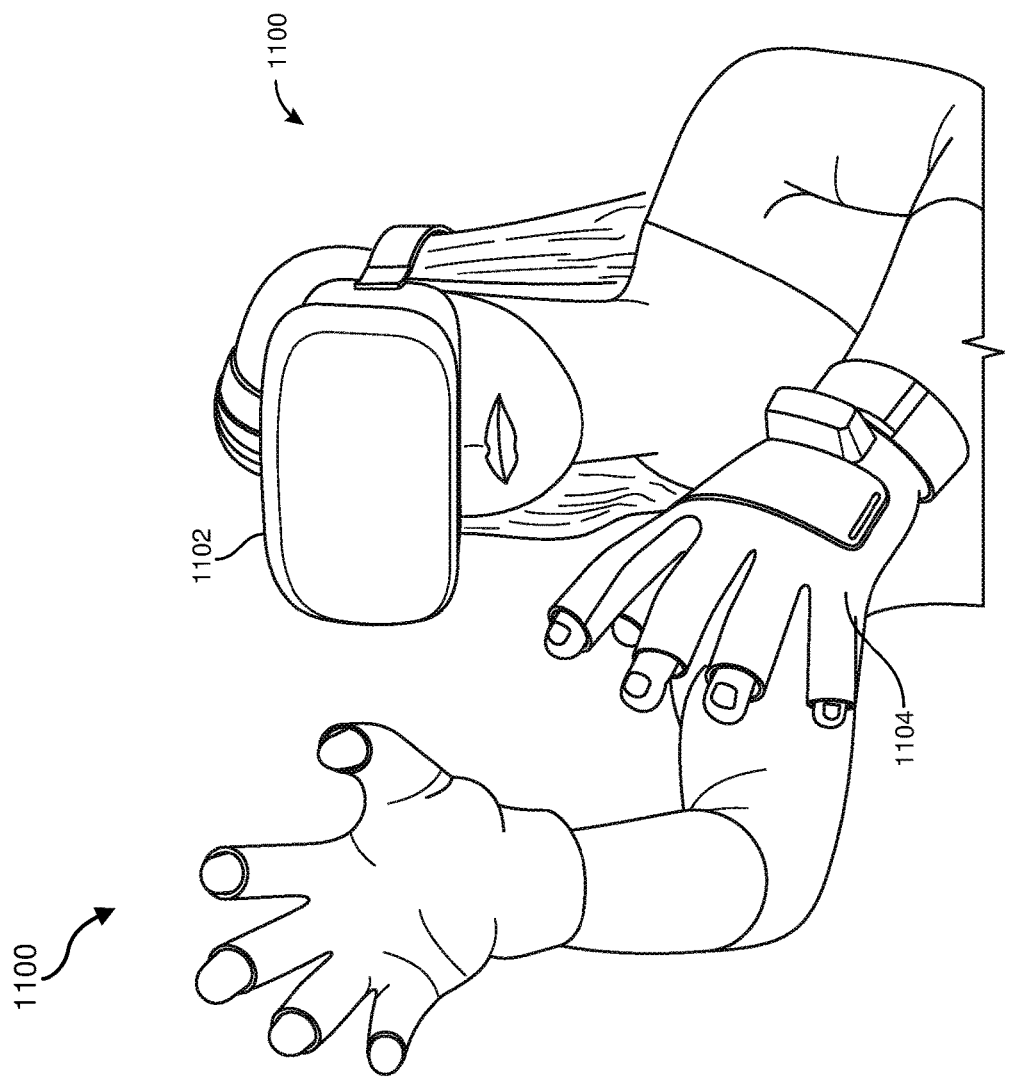
FIG. 11 is an illustration of exemplary haptic devices that may be used in connection with embodiments of this disclosure.

Haptic feedback may be provided by interfaces positioned within a user's environment (e.g., chairs, tables, floors, etc.) and/or interfaces on articles that may be worn or carried by a user (e.g., gloves, wristbands, etc.). As an example, FIG. 11 illustrates a vibrotactile system 1100 in the form of a wearable glove (haptic device 1110) and wristband (haptic device 1120). Haptic device 1110 and haptic device 1120 are shown as examples of wearable devices that include a flexible, wearable textile material 1130 that is shaped and configured for positioning against a user's hand and wrist, respectively. This disclosure also includes vibrotactile systems that may be shaped and configured for positioning against other human body parts, such as a finger, an arm, a head, a torso, a foot, or a leg. By way of example and not limitation, vibrotactile systems according to various embodiments of the present disclosure may also be in the form of a glove, a headband, an armband, a sleeve, a head covering, a sock, a shirt, or pants, among other possibilities. In some examples, the term "textile" may include any flexible, wearable material, including woven fabric, non-woven fabric, leather, cloth, a flexible polymer material, composite materials, etc.

One or more vibrotactile devices 1140 may be positioned at least partially within one or more corresponding pockets formed in textile material 1130 of vibrotactile system 1100. Vibrotactile devices 1140 may be positioned in locations to provide a vibrating sensation (e.g., haptic feedback) to a user of vibrotactile system 1100. For example, vibrotactile devices 1140 may be positioned against the user's finger(s), thumb, or wrist, as shown in FIG. 11. Vibrotactile devices 1140 may, in some examples, be sufficiently flexible to conform to or bend with the user's corresponding body part(s).

A power source 1150 (e.g., a battery) for applying a voltage to the vibrotactile devices 1140 for activation thereof may be electrically coupled to vibrotactile devices 1140, such as via conductive wiring 1152. In some examples, each of vibrotactile devices 1140 may be independently electrically coupled to power source 1150 for individual activation. In some embodiments, a processor 1160 may be operatively coupled to power source 1150 and configured (e.g., programmed) to control activation of vibrotactile devices 1140.

Vibrotactile system 1100 may be implemented in a variety of ways. In some examples, vibrotactile system 1100 may be a standalone system with integral subsystems and components for operation independent of other devices and systems. As another example, vibrotactile system 1100 may be configured for interaction with another device or system 1170. For example, vibrotactile system 1100 may, in some examples, include a communications interface 1180 for receiving and/or sending signals to the other device or system 1170. The other device or system 1170 may be a mobile device, a gaming console, an artificial-reality (e.g., virtual-reality, augmented-reality, mixed-reality) device, a personal computer, a tablet computer, a network device (e.g., a modem, a router, etc.), a handheld controller, etc. Communications interface 1180 may enable communications between vibrotactile system 1100 and the other device or system 1170 via a wireless (e.g., Wi-Fi, BLUETOOTH, cellular, radio, etc.) link or a wired link. If present, communications interface 1180 may be in communication with processor 1160, such as to provide a signal to processor 1160 to activate or deactivate one or more of the vibrotactile devices 1140.

Vibrotactile system 1100 may optionally include other subsystems and components, such as touch-sensitive pads 1190, pressure sensors, motion sensors, position sensors, lighting elements, and/or user interface elements (e.g., an on/off button, a vibration control element, etc.). During use, vibrotactile devices 1140 may be configured to be activated for a variety of different reasons, such as in response to the user's interaction with user interface elements, a signal from the motion or position sensors, a signal from the touch-sensitive pads 1190, a signal from the pressure sensors, a signal from the other device or system 1170, etc.

Although power source 1150, processor 1160, and communications interface 1180 are illustrated in FIG. 11 as being positioned in haptic device 1120, the present disclosure is not so limited. For example, one or more of power source 1150, processor 1160, or communications interface 1180 may be positioned within haptic device 1110 or within another wearable textile.

Figure 12:
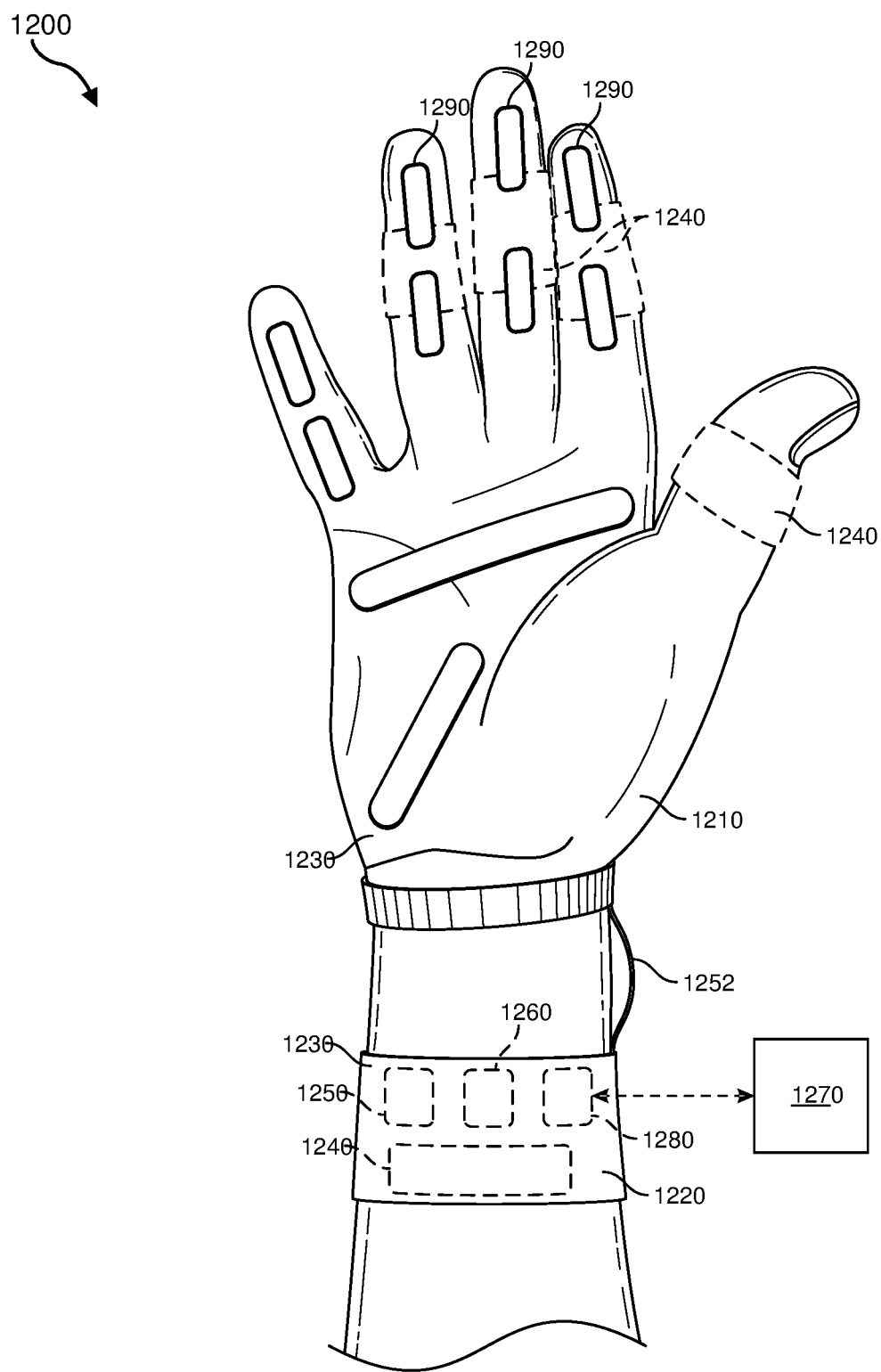
FIG. 12 is an illustration of an exemplary virtual-reality environment according to embodiments of this disclosure.

Haptic wearables, such as those shown in and described in connection with FIG. 11, may be implemented in a variety of types of artificial-reality systems and environments. FIG. 12 shows an example artificial-reality environment 1200 including one head-mounted virtual-reality display and two haptic devices (i.e., gloves), and in other embodiments any number and/or combination of these components and other components may be included in an artificial-reality system. For example, in some embodiments there may be multiple head-mounted displays each having an associated haptic device, with each head-mounted display and each haptic device communicating with the same console, portable computing device, or other computing system.

Figure 10:
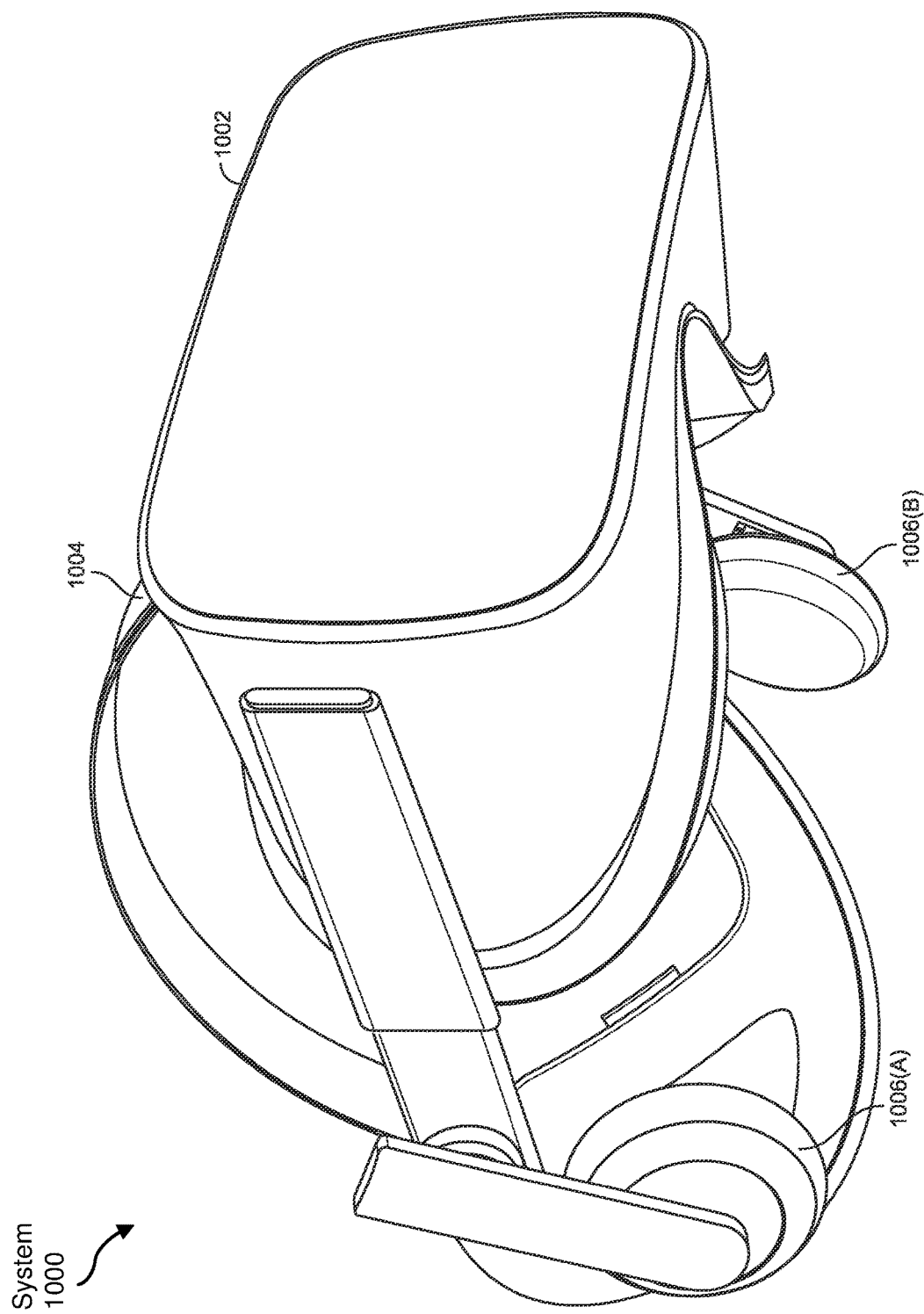
FIG. 10 is an illustration of an exemplary virtual-reality headset that may be used in connection with embodiments of this disclosure.

Head-mounted display 1202 generally represents any type or form of virtual-reality system, such as virtual-reality system 1000 in FIG. 10. Haptic device 1204 generally represents any type or form of wearable device, worn by a user of an artificial-reality system, that provides haptic feedback to the user to give the user the perception that he or she is physically engaging with a virtual object. In some embodiments, haptic device 1204 may provide haptic feedback by applying vibration, motion, and/or force to the user. For example, haptic device 1204 may limit or augment a user's movement. To give a specific example, haptic device 1204 may limit a user's hand from moving forward so that the user has the perception that his or her hand has come in physical contact with a virtual wall. In this specific example, one or more actuators within the haptic device may achieve the physical-movement restriction by pumping fluid into an inflatable bladder of the haptic device. In some examples, a user may also use haptic device 1204 to send action requests to a console. Examples of action requests include, without limitation, requests to start an application and/or end the application and/or requests to perform a particular action within the application.

Figure 13:
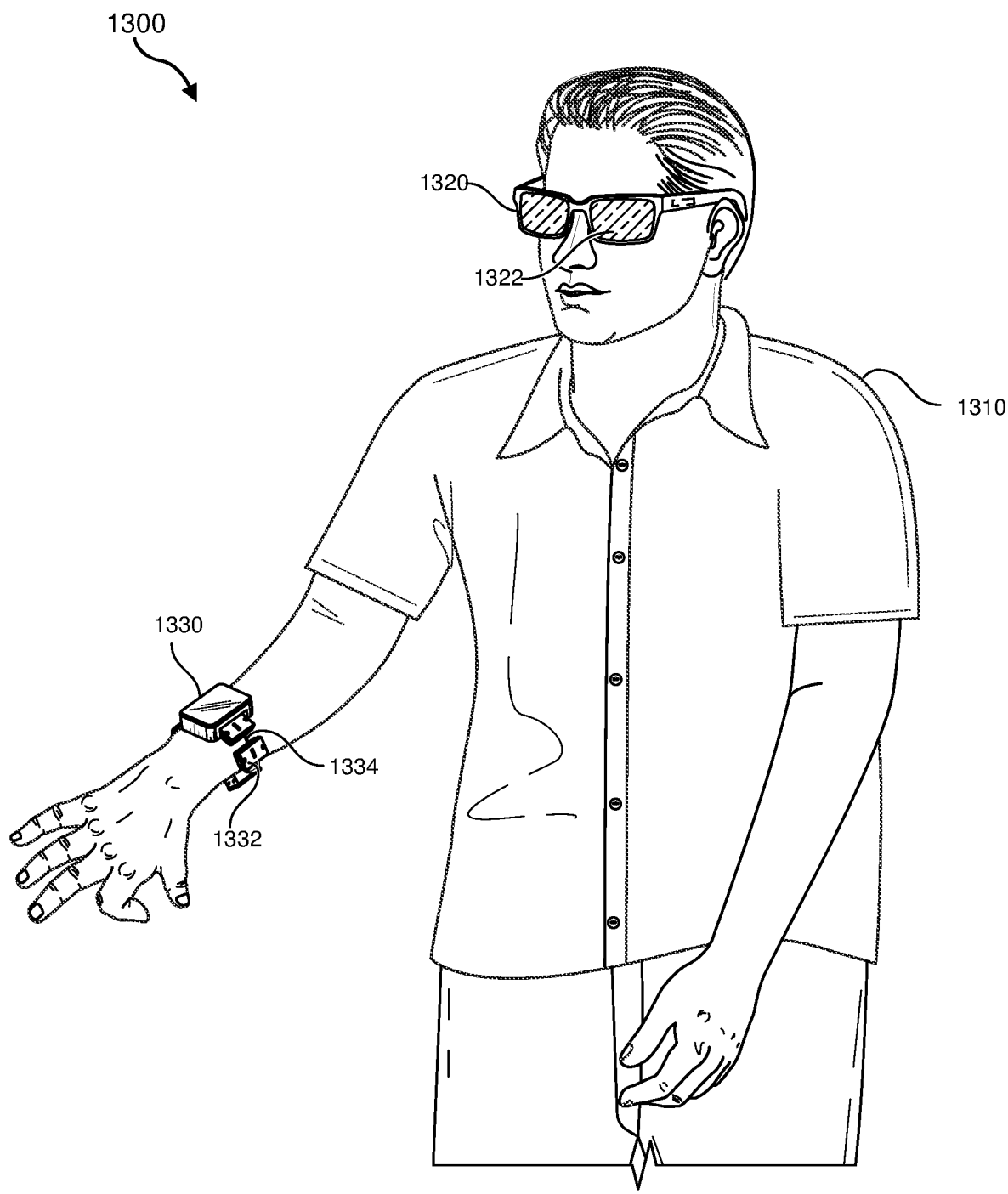
FIG. 13 is an illustration of an exemplary augmented-reality environment according to embodiments of this disclosure.

While haptic interfaces may be used with virtual-reality systems, as shown in FIG. 12, haptic interfaces may also be used with augmented-reality systems, as shown in FIG. 13. FIG. 13 is a perspective view of a user 1310 interacting with an augmented-reality system 1300. In this example, user 1310 may wear a pair of augmented-reality glasses 1320 that may have one or more displays 1322 and that are paired with a haptic device 1330. In this example, haptic device 1330 may be a wristband that includes a plurality of band elements 1332 and a tensioning mechanism 1334 that connects band elements 1332 to one another.

One or more of band elements 1332 may include any type or form of actuator suitable for providing haptic feedback. For example, one or more of band elements 1332 may be configured to provide one or more of various types of cutaneous feedback, including vibration, force, traction, texture, and/or temperature. To provide such feedback, band elements 1332 may include one or more of various types of actuators. In one example, each of band elements 1332 may include a vibrotactor (e.g., a vibrotactile actuator) configured to vibrate in unison or independently to provide one or more of various types of haptic sensations to a user. Alternatively, only a single band element or a subset of band elements may include vibrotactors.

Haptic devices 1110, 1120, 1204, and 1330 may include any suitable number and/or type of haptic transducer, sensor, and/or feedback mechanism. For example, haptic devices 1110, 1120, 1204, and 1330 may include one or more mechanical transducers, piezoelectric transducers, and/or fluidic transducers. Haptic devices 1110, 1120, 1204, and 1330 may also include various combinations of different types and forms of transducers that work together or independently to enhance a user's artificial-reality experience. In one example, each of band elements 1332 of haptic device 1330 may include a vibrotactor (e.g., a vibrotactile actuator) configured to vibrate in unison or independently to provide one or more of various types of haptic sensations to a user.

Figure 14A:
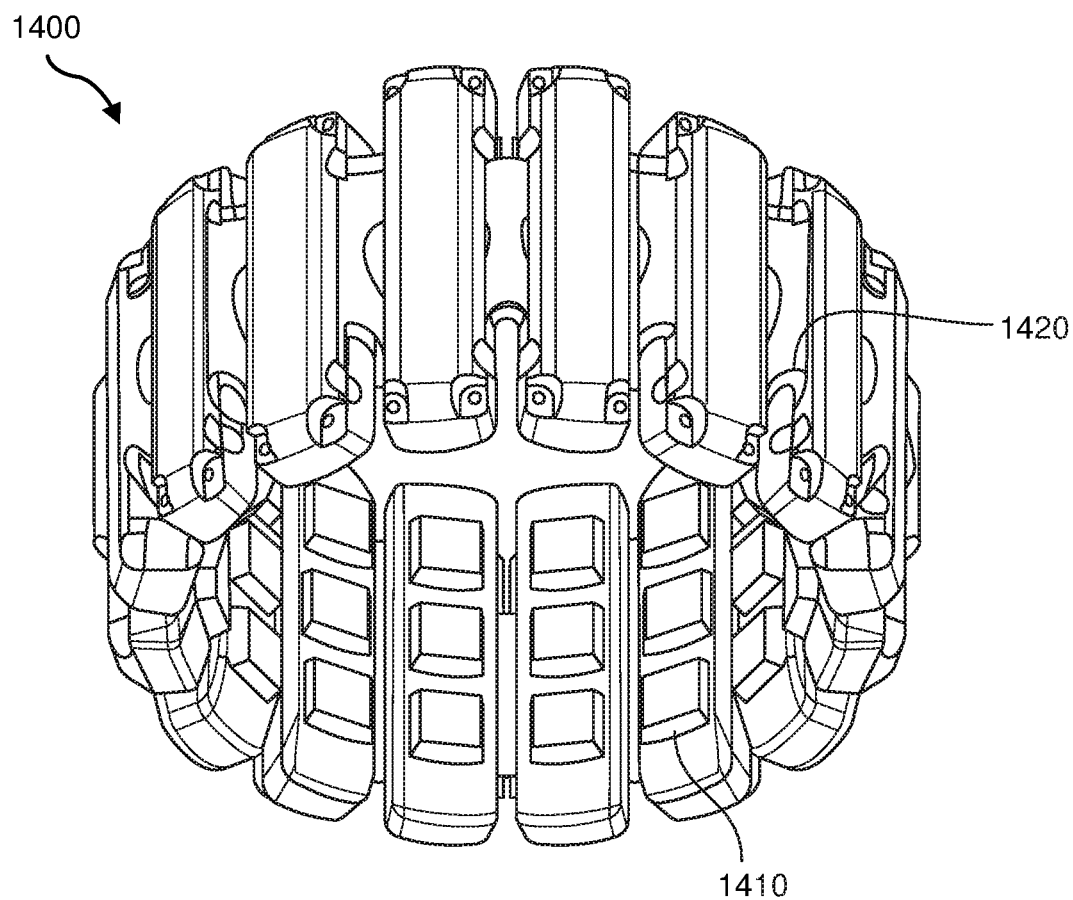
FIGS. 14A and 14B are illustrations of an exemplary human-machine interface configured to be worn around a user's lower arm or wrist.
Figure 14B:
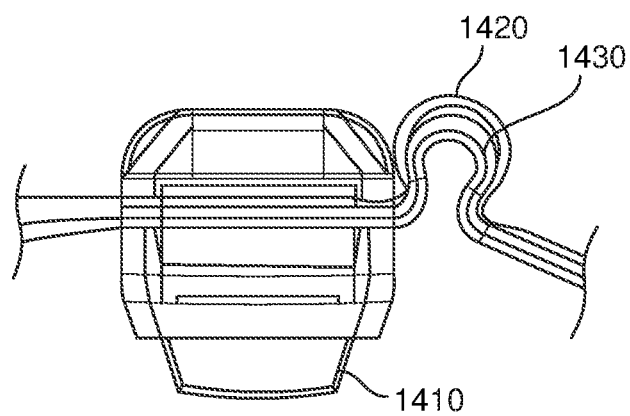

FIG. 14A illustrates an exemplary human-machine interface (also referred to herein as an EMG control interface) configured to be worn around a user's lower arm or wrist as a wearable system 1400. In this example, wearable system 1400 may include sixteen neuromuscular sensors 1410 (e.g., EMG sensors) arranged circumferentially around an elastic band 1420 with an interior surface 930 configured to contact a user's skin. However, any suitable number of neuromuscular sensors may be used. The number and arrangement of neuromuscular sensors may depend on the particular application for which the wearable device is used. For example, a wearable armband or wristband can be used to generate control information for controlling an augmented reality system, a robot, controlling a vehicle, scrolling through text, controlling a virtual avatar, or any other suitable control task. As shown, the sensors may be coupled together using flexible electronics incorporated into the wireless device. FIG. 14B illustrates a cross-sectional view through one of the sensors of the wearable device shown in FIG. 14A. In some embodiments, the output of one or more of the sensing components can be optionally processed using hardware signal processing circuitry (e.g., to perform amplification, filtering, and/or rectification). In other embodiments, at least some signal processing of the output of the sensing components can be performed in software. Thus, signal processing of signals sampled by the sensors can be performed in hardware, software, or by any suitable combination of hardware and software, as aspects of the technology described herein are not limited in this respect. A non-limiting example of a signal processing chain used to process recorded data from sensors 1410 is discussed in more detail below with reference to FIGS. 15A and 15B.

FIGS. 15A and 15B illustrate an exemplary schematic diagram with internal components of a wearable system with EMG sensors. As shown, the wearable system may include a wearable portion 1510 (FIG. 15A) and a dongle portion 1520 (FIG. 15B) in communication with the wearable portion 1510 (e.g., via BLUETOOTH or another suitable wireless communication technology). As shown in FIG. 15A, the wearable portion 1510 may include skin contact electrodes 1511, examples of which are described in connection with FIGS. 14A and 14B. The output of the skin contact electrodes 1511 may be provided to analog front end 1530, which may be configured to perform analog processing (e.g., amplification, noise reduction, filtering, etc.) on the recorded signals. The processed analog signals may then be provided to analog-to-digital converter 1532, which may convert the analog signals to digital signals that can be processed by one or more computer processors. An example of a computer processor that may be used in accordance with some embodiments is microcontroller (MCU) 1534, illustrated in FIG. 15A. As shown, MCU 1534 may also include inputs from other sensors (e.g., IMU sensor 1540), and power and battery module 1542. The output of the processing performed by MCU 1534 may be provided to antenna 1550 for transmission to dongle portion 1520 shown in FIG. 15B.

Dongle portion 1520 may include antenna 1552, which may be configured to communicate with antenna 1550 included as part of wearable portion 1510. Communication between antennas 1550 and 1552 may occur using any suitable wireless technology and protocol, non-limiting examples of which include radiofrequency signaling and BLUETOOTH. As shown, the signals received by antenna 1552 of dongle portion 1520 may be provided to a host computer for further processing, display, and/or for effecting control of a particular physical or virtual object or objects.

Although the examples provided with reference to FIGS. 14A-14B and FIGS. 15A-15B are discussed in the context of interfaces with EMG sensors, the techniques described herein for reducing electromagnetic interference can also be implemented in wearable interfaces with other types of sensors including, but not limited to, mechanomyography (MMG) sensors, sonomyography (SMG) sensors, and electrical impedance tomography (EIT) sensors. The techniques described herein for reducing electromagnetic interference can also be implemented in wearable interfaces that communicate with computer hosts through wires and cables (e.g., USB cables, optical fiber cables, etc.).

As detailed above, the computing devices and systems described and/or illustrated herein broadly represent any type or form of computing device or system capable of executing computer-readable instructions, such as those contained within the modules described herein. In their most basic configuration, these computing device(s) may each include at least one memory device and at least one physical processor.

In some examples, the term "memory device" generally refers to any type or form of volatile or non-volatile storage device or medium capable of storing data and/or computer-readable instructions. In one example, a memory device may store, load, and/or maintain one or more of the modules described herein. Examples of memory devices include, without limitation, Random Access Memory (RAM), Read Only Memory (ROM), flash memory, Hard Disk Drives (HDDs), Solid-State Drives (SSDs), optical disk drives, caches, variations or combinations of one or more of the same, or any other suitable storage memory.

In some examples, the term "physical processor" generally refers to any type or form of hardware-implemented processing unit capable of interpreting and/or executing computer-readable instructions. In one example, a physical processor may access and/or modify one or more modules stored in the above-described memory device. Examples of physical processors include, without limitation, microprocessors, microcontrollers, Central Processing Units (CPUs), Field-Programmable Gate Arrays (FPGAs) that implement softcore processors, Application-Specific Integrated Circuits (ASICs), portions of one or more of the same, variations or combinations of one or more of the same, or any other suitable physical processor.

Although illustrated as separate elements, the modules described and/or illustrated herein may represent portions of a single module or application. In addition, in certain embodiments one or more of these modules may represent one or more software applications or programs that, when executed by a computing device, may cause the computing device to perform one or more tasks. For example, one or more of the modules described and/or illustrated herein may represent modules stored and configured to run on one or more of the computing devices or systems described and/or illustrated herein. One or more of these modules may also represent all or portions of one or more special-purpose computers configured to perform one or more tasks.

In addition, one or more of the modules described herein may transform data, physical devices, and/or representations of physical devices from one form to another. Additionally or alternatively, one or more of the modules recited herein may transform a processor, volatile memory, non-volatile memory, and/or any other portion of a physical computing device from one form to another by executing on the computing device, storing data on the computing device, and/or otherwise interacting with the computing device.

In some embodiments, the term "computer-readable medium" generally refers to any form of device, carrier, or medium capable of storing or carrying computer-readable instructions. Examples of computer-readable media include, without limitation, transmission-type media, such as carrier waves, and non-transitory-type media, such as magnetic-storage media (e.g., hard disk drives, tape drives, and floppy disks), optical-storage media (e.g., Compact Disks (CDs), Digital Video Disks (DVDs), and BLU-RAY disks), electronic-storage media (e.g., solid-state drives and flash media), and other distribution systems.

The process parameters and sequence of the steps described and/or illustrated herein are given by way of example only and can be varied as desired. For example, while the steps illustrated and/or described herein may be shown or discussed in a particular order, these steps do not necessarily need to be performed in the order illustrated or discussed. The various exemplary methods described and/or illustrated herein may also omit one or more of the steps described or illustrated herein or include additional steps in addition to those disclosed.

The preceding description has been provided to enable others skilled in the art to best utilize various aspects of the exemplary embodiments disclosed herein. This exemplary description is not intended to be exhaustive or to be limited to any precise form disclosed. Many modifications and variations are possible without departing from the spirit and scope of the present disclosure. The embodiments disclosed herein should be considered in all respects illustrative and not restrictive. Reference should be made to the appended claims and their equivalents in determining the scope of the present disclosure.

Unless otherwise noted, the terms "connected to" and "coupled to" (and their derivatives), as used in the specification and claims, are to be construed as permitting both direct and indirect (i.e., via other elements or components) connection. In addition, the terms "a" or "an," as used in the specification and claims, are to be construed as meaning "at least one of." Finally, for ease of use, the terms "including" and "having" (and their derivatives), as used in the specification and claims, are interchangeable with and have the same meaning as the word "comprising."

What is claimed is:

1. An apparatus comprising:
a capacitive proximity sensor that increases capacitance in response to proximity of an object;
a reference capacitor in parallel with the capacitive proximity sensor;
a switch that connects and disconnects the capacitive proximity sensor and the reference capacitor; and
a capacitance sensing block that generates a capacitance signal based on a capacitance of the reference capacitor when the switch is in a disconnecting state and based on the capacitance of the reference capacitor and a capacitance of the capacitive proximity sensor when the switch is in a connecting state,
wherein the reference capacitor produces a baseline capacitance level beyond which capacitance sensed by the capacitance sensing block comprises capacitance from proximity of an object to the capacitive proximity sensor, and
wherein the baseline capacitance level is removed from the amount of capacitance sensed by the capacitance sensing block.

2. The apparatus of claim 1, further comprising an interface that provides, as output, a proximity signal indicating the proximity of the object.

3. The apparatus of claim 2, wherein the proximity signal indicates a proximity of the object absent contact between the object and a surface of the apparatus proximate to the capacitive proximity sensor.

4. The apparatus of claim 3, wherein the proximity signal indicates a degree of the proximity of the object within a predetermined range of distances.

5. The apparatus of claim 1, further comprising a highpass filter that modifies the capacitance signal by attenuating a 1/f noise of the capacitance signal.

6. The apparatus of claim 1, wherein the switch periodically switches between the connecting state and the disconnecting state.

7. The apparatus of claim 6, further comprising a synchronous detector that receives the capacitance signal and that is synchronized based on a frequency at which the switch periodically switches.

8. The apparatus of claim 7, wherein the synchronous detector is synchronized to a lower frequency than the frequency at which the switch periodically switches, the lower frequency being lower than the frequency by a predetermined amount.

9. The apparatus of claim 7, wherein the synchronous detector produces a signal with an in-phase and quadrature component of the capacitance signal.

10. A system comprising:
an apparatus comprising:
a capacitive proximity sensor that increases capacitance in response to proximity of a user;
a reference capacitor in parallel with the capacitive proximity sensor;
a switch that connects and disconnects the capacitive proximity sensor and the reference capacitor;
a capacitance sensing block that generates a capacitance signal based on a capacitance of the reference capacitor when the switch is in a disconnecting state and based on the capacitance of the reference capacitor and a capacitance of the capacitive proximity sensor when the switch is in a connecting state,
wherein the reference capacitor produces a baseline capacitance level beyond which capacitance sensed by the capacitance sensing block comprises capacitance from proximity of an object to the capacitive proximity sensor, and
wherein the baseline capacitance level is removed from the amount of capacitance sensed by the capacitance sensing block; and
an interface that receives, as input, the capacitance signal and provides, as output, a proximity signal indicating the proximity of the user; and
a device in communication with the apparatus via the interface, the device comprising a user interface element that responds to the proximity of the user.

11. The system of claim 10, wherein the reference capacitor produces a baseline capacitance level beyond which capacitance sensed by the capacitance sensing block is attributable to capacitance from proximity of an object to the capacitive proximity sensor.

12. The system of claim 10, where the user interface element generates a feedback response that indicates to the user the proximity of the user.

13. The system of claim 12, wherein the proximity signal indicates a proximity of the user absent contact between the user and a surface of the apparatus proximate to the capacitive proximity sensor.

14. The system of claim 13, wherein the proximity signal indicates a degree of the proximity of the user within a predetermined range of distances.

15. The system of claim 10, further comprising a highpass filter that modifies the capacitance signal by attenuating a 1/f noise of the capacitance signal.

16. The system of claim 10, wherein the switch periodically switches between the connecting state and the disconnecting state.

17. The system of claim 16, further comprising a synchronous detector that receives the capacitance signal and that is synchronized based on a frequency at which the switch periodically switches.

18. The system of claim 17, wherein the synchronous detector is synchronized to a lower frequency than the frequency at which the switch periodically switches, the lower frequency being lower than the frequency by a predetermined amount.

19. A system comprising:
- at least one physical processor;
- physical memory comprising computer-executable instructions that, when executed by the physical processor, cause the physical processor to:
- receive, via an interface of an apparatus, a proximity signal, the apparatus comprising:
  - a capacitive proximity sensor that increases capacitance in response to proximity of a user;
  - a reference capacitor in parallel with the capacitive proximity sensor;
  - a switch that connects and disconnects the capacitive proximity sensor and the reference capacitor;
  - a capacitance sensing block that generates a capacitance signal based on a capacitance of the reference capacitor when the switch is in a disconnecting state and based on the capacitance of the reference capacitor and a capacitance of the capacitive proximity sensor when the switch is in a connecting state,
  - wherein the reference capacitor produces a baseline capacitance level beyond which capacitance sensed by the capacitance sensing block comprises capacitance from proximity of an object to the capacitive proximity sensor, and
  - wherein the baseline capacitance level is removed from the amount of capacitance sensed by the capacitance sensing block; and
  - the interface that receives, as input, the capacitance signal and provides, as output, the proximity signal indicating the proximity of the user;
- determine, based on the proximity signal, the proximity of the user to the capacitive proximity sensor; and
- execute a predefined function based on the proximity of the user to the capacitive proximity sensor.

20. The system of claim 19, further comprising a highpass filter that modifies the capacitance signal by attenuating a 1/f noise of the capacitance signal.

\* \* \* \* \*